(12) United States Patent
Kishi et al.

(10) Patent No.: US 9,921,257 B2
(45) Date of Patent: Mar. 20, 2018

(54) CRYSTAL UNIT

(71) Applicant: FUJITSU LIMITED, Kawasaki-shi, Kanagawa (JP)

(72) Inventors: Masakazu Kishi, Kawasaki (JP); Hajime Kubota, Kawasaki (JP); Masayuki Itoh, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 240 days.

(21) Appl. No.: 14/974,434

(22) Filed: Dec. 18, 2015

(65) Prior Publication Data

US 2016/0231368 A1 Aug. 11, 2016

(30) Foreign Application Priority Data

Feb. 6, 2015 (JP) .................................. 2015-022455

(51) Int. Cl.
*G01R 29/22* (2006.01)
*H03H 9/10* (2006.01)
(Continued)

(52) U.S. Cl.
CPC .............. *G01R 29/22* (2013.01); *H03B 5/32* (2013.01); *H03H 9/1021* (2013.01); *H03H 9/13* (2013.01);
(Continued)

(58) Field of Classification Search
CPC ........ G01R 29/00; G01R 29/22; G01R 27/00; H03B 5/00; H03B 5/30; H03B 5/32;
(Continued)

(56) References Cited

U.S. PATENT DOCUMENTS 2,440,886 A    5/1948  Bach
2,476,954 A    7/1949  Blackburn
(Continued)

FOREIGN PATENT DOCUMENTS

JP    2004-007469    1/2004
JP    2011-135342    7/2011

OTHER PUBLICATIONS

U.S. Office Action of co-pending U.S. Appl. No. 14/970,651 dated Nov. 13, 2017, 40 pages.
(Continued)

*Primary Examiner* — Hoai-An D Nguyen
(74) *Attorney, Agent, or Firm* — Fujitsu Patent Center

(57) ABSTRACT

A crystal unit includes: a crystal blank; an excitation electrode formed on the crystal blank and excites a main vibration of the crystal blank; a housing that accommodates the crystal blank; and a sub-vibration electrode formed on the housing and excites a sub-vibration of the crystal blank. And a method for inspecting a crystal unit, the method includes: generating a sub-vibration in a crystal blank by applying an input signal to a sub-vibration electrode formed on a housing, which accommodates the crystal blank, via external electrodes which are electrically coupled to the sub-vibration electrode and formed on the outer surface of the housing; obtaining an output of the crystal unit via the external electrodes; obtaining frequency characteristics of impedance between the external electrodes based on the output; and comparing the obtained frequency characteristics with the reference frequency characteristics indicating the quality of the crystal unit.

15 Claims, 17 Drawing Sheets

(51) Int. Cl.
*H03H 9/13* (2006.01)
*H03B 5/32* (2006.01)
*G01L 1/16* (2006.01)
*G01L 9/00* (2006.01)
*G01L 1/10* (2006.01)

(52) U.S. Cl.
CPC .............. *G01L 1/10* (2013.01); *G01L 1/162* (2013.01); *G01L 9/008* (2013.01)

(58) Field of Classification Search
CPC ............ H03H 9/00; H03H 9/02; H03H 9/125; H03H 9/13; H03H 9/1021; G01L 1/10; G01L 1/162; G01L 1/183; G01L 9/008; G01J 5/44; G04F 5/06; G01B 7/063; G01B 7/066
USPC ........ 324/600, 727, 500, 537, 760.01, 76.11, 324/76.39, 76.49
See application file for complete search history.

(56) References Cited

U.S. PATENT DOCUMENTS

| | | | |
|---|---|---|---|
| 2,846,874 | A | 8/1958 | Horn |
| 4,387,503 | A | 6/1983 | Aswell et al. |
| 5,319,324 | A * | 6/1994 | Satoh ...................... H03L 1/025 29/25.35 |
| 7,424,827 | B2 | 9/2008 | Yamada et al. |
| 8,304,961 | B2 | 11/2012 | Goto et al. |
| 2006/0139115 | A1* | 6/2006 | Mizumura ............... H03B 5/36 331/176 |
| 2007/0040470 | A1* | 2/2007 | Watanabe .......... G01C 19/5607 310/316.01 |
| 2007/0075796 | A1 | 4/2007 | Mizumura et al. |
| 2007/0229178 | A1 | 10/2007 | Harima |
| 2009/0066190 | A1* | 3/2009 | Harima ................ H03H 9/0519 310/348 |
| 2009/0066426 | A1 | 3/2009 | Harima et al. |
| 2009/0160561 | A1 | 6/2009 | Murase |
| 2009/0167448 | A1 | 7/2009 | Yamakawa |
| 2011/0156823 | A1 | 6/2011 | Koyama et al. |
| 2012/0056684 | A1* | 3/2012 | Kishi ...................... H03H 3/02 331/107 R |
| 2012/0062072 | A1* | 3/2012 | Kubota ................ H03H 9/0509 310/348 |
| 2012/0112761 | A1 | 5/2012 | Sonnhueter et al. |
| 2013/0213137 | A1 | 8/2013 | Ostapenko |
| 2015/0116044 | A1 | 4/2015 | Itasaka et al. |
| 2016/0223391 | A1* | 8/2016 | Kishi .................... G01H 15/00 |

OTHER PUBLICATIONS

MtronPTI, "Understanding Quartz Crystals", Aug. 25, 2014, 7 pages, www.mtronpti.com.
Cartright, Jeff ,"Aging Performance in Crystals", Connor Winfield, Oct. 2008, 2 pages.
Vectron International, "Aging and Retrace in Oven Controlled Crystal Oscillators", Aug. 16, 2011, 3 pages.

* cited by examiner

CRYSTAL UNIT

CROSS-REFERENCE TO RELATED APPLICATION

This application is based upon and claims the benefit of priority of the prior Japanese Patent Application No. 2015-022455, filed on Feb. 6, 2015, the entire contents of which are incorporated herein by reference.

FIELD

The embodiments discussed herein are related to a crystal unit.

BACKGROUND

There has been known a piezoelectric oscillator which includes an auxiliary oscillator having an auxiliary electrode provided separately from a main electrode on a piezoelectric substrate, detects a frequency of an oscillation output signal of the auxiliary oscillator, and estimates a temperature of a crystal unit based on the frequency and the temperature characteristics of the frequency of the auxiliary oscillator.

In recent years, in an effort to meet the requirements of reduction in device size, compactness and high-density packaging of parts and modules are in progress. With no exception, the downsizing of the crystal units serving as clock sources have also been in progress. Under such circumstances, when it is considered that a function failure has occurred in a device due to an abnormality of a crystal unit, it is useful to provide the ability to inspect the electrical characteristics of the crystal unit in a state where it is packaged into the device. This is because it is difficult to take out and inspect only the crystal unit for the reason that peripheral parts may be damaged when the crystal unit is removed from the device in a high-density packaging state.

The following is a reference document.
[Document 1] Japanese Laid-Open Patent Publication No. 2011-135342.

SUMMARY

According to an aspect of the invention, a crystal unit includes: a crystal blank; an excitation electrode formed on the crystal blank and excites a main vibration of the crystal blank; a housing that accommodates the crystal blank; and a sub-vibration electrode formed on the housing and excites a sub-vibration of the crystal blank.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, various embodiments will be described in detail with reference to the accompanying drawings.

Figure 1:
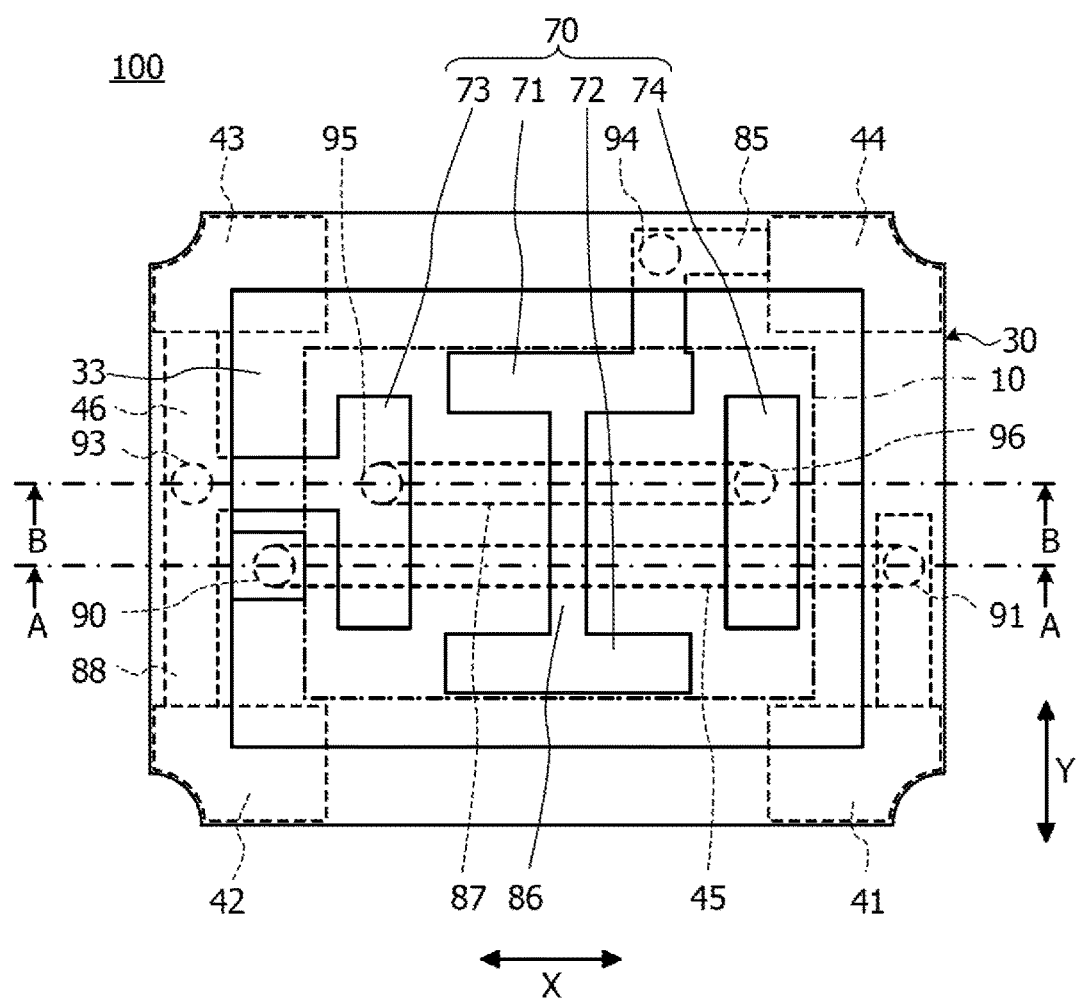
FIG. 1 is a top view schematically illustrating a crystal unit 100 according to one embodiment (Embodiment 1)
Figure 2:
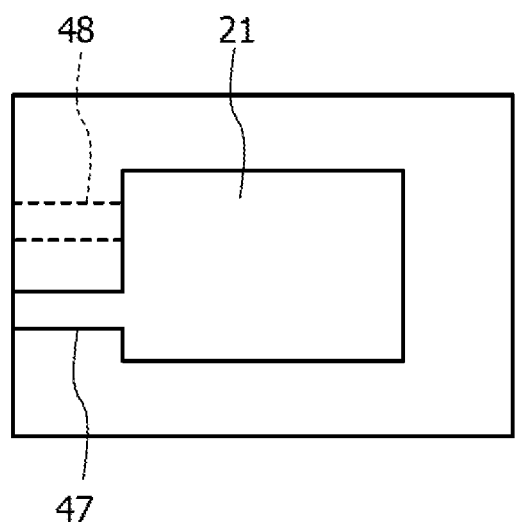
FIG. 2 is a top view illustrating a crystal blank 10 and an excitation electrode 20.
Figure 3A:
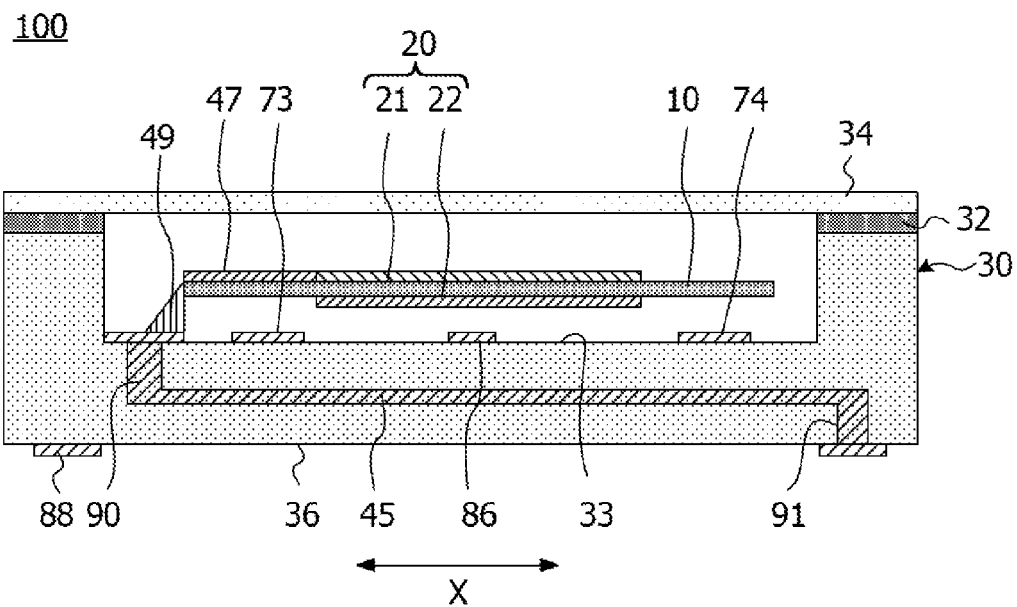
FIGS. 3A and 3B are sectional views of the crystal unit 100.
Figure 3B:
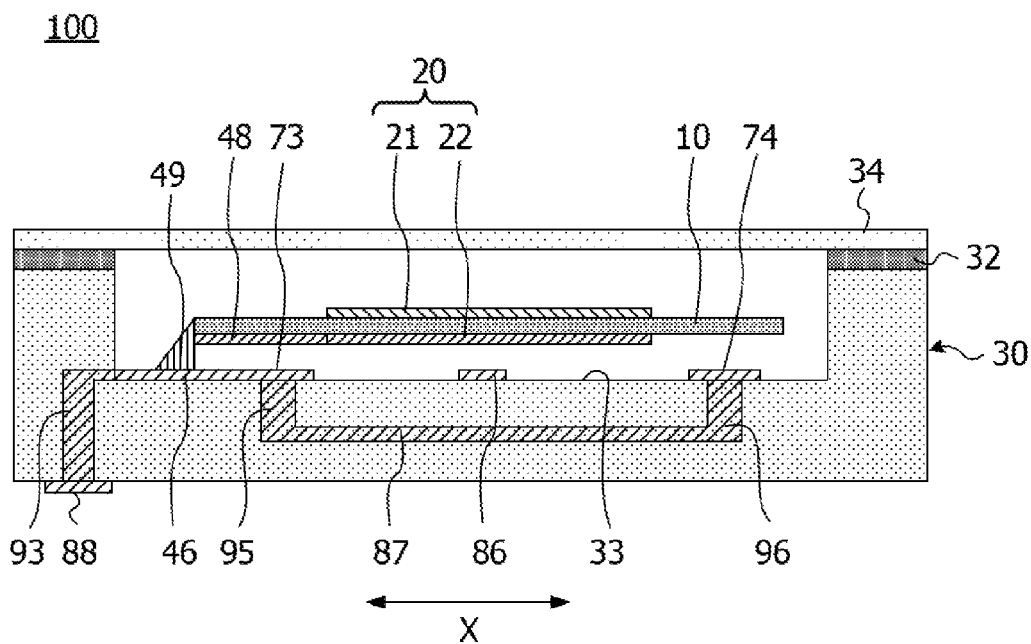

FIG. 1 is a top view schematically illustrating a crystal unit 100 according to one embodiment (Embodiment 1). In FIG. 1, a cover of a housing 30 is not illustrated to allow the interior of the housing 30 to be visible. In FIG. 1, with regard to a crystal blank 10 and an excitation electrode 20, only the contour of the crystal blank 10 is indicated by a dashed-dotted line to allow the bottom of the housing 30 to be visible. In the following description, with the thickness direction of the crystal blank 10 (e.g., the vertical direction of FIG. 1) assumed as a vertical direction, a side in which the cover of the housing 30 is placed is referred to as an "upper side." However, the orientation of the mounting state of the crystal unit 100 is optional. An X direction is defined by a direction corresponding to the main vibration direction of the crystal unit 100, as illustrated in FIG. 1, and a Y direction is defined by a direction which is parallel to the surface of the crystal blank 10 and perpendicular to the main vibration direction of the crystal unit 100, as illustrated in FIG. 1. FIG. 2 is a top view illustrating the crystal blank 10 and the excitation electrode 20. FIGS. 3A and 3B are sectional views of the crystal unit 100, FIG. 3A being a sectional view taken along line A-A in FIG. 1 and FIG. 3B being a sectional view taken along line B-B in FIG. 1.

The crystal unit 100 includes the crystal blank 10, the excitation electrode 20, the housing 30, external electrodes 41 to 44, and a sub-vibration electrode 70. The crystal unit 100 is of a surface mounting type, as illustrated in FIG. 1.

The crystal blank 10 may be, for example, an AT-cut artificial crystal substrate. In the example illustrated in FIG. 1, the crystal blank 10 has a rectangular shape when viewed from the top. However, the crystal blank 10 may have other different shapes. The crystal blank 10 may be supported in a cantilever structure to the housing 30. In the example illustrated in FIGS. 1 to 3B, the crystal blank 10 is supported in a cantilever structure on one end side of the housing 30 in the X direction. In the example illustrated in FIGS. 1 to 3B, in an operation of the crystal unit 100, the crystal blank 10 is intended to vibrate in the X direction (e.g., a thickness sliding vibration). In addition, the crystal blank 10 may be cantilevered at the end of the Y direction. Hereinafter, the vibration of the crystal blank 10 in the X direction (e.g., a thickness sliding vibration) is called a "main vibration."

In an operation of the crystal unit 100, the excitation electrode 20 excites the main vibration of the crystal blank 10. The excitation electrode 20 includes an upper excitation electrode 21 formed on the upper surface of the crystal blank 10 and a lower excitation electrode 22 formed on the lower surface of the crystal blank 10. In an operation of the crystal unit 100, the main vibration of the crystal blank 10 is excited by a potential difference between the upper excitation electrode 21 and the lower excitation electrode 22.

The housing 30 accommodates the crystal blank 10. The housing 30 is a ceramic package formed by laminating layers made of, for example, a ceramic material. As illustrated in FIGS. 3A and 3B, the housing 30 includes a cover 34 and encapsulates the crystal blank 10 in the inner space of the housing 30 in an airtight manner. For example, the inner space of the housing 30 is in a vacuum state or is filled with dry nitrogen and is sealed by the cover 34. In the example illustrated in FIGS. 3A and 3B, the cover 34 is coupled to the body of the housing 30 via a seal member 32.

The external electrodes 41 to 44 are formed in the housing 30. The external electrodes 41 to 44 are formed on the outer surface of the housing 30. In the example illustrated in FIGS. 1 to 3B, the external electrodes 41 to 44 are formed on the lower surface 36 of the housing 30. The external electrodes 41 and 43 are electrically connected to the upper excitation electrode 21 and the lower excitation electrode 22, respectively. In the example illustrated in FIGS. 1 to 3B, the external electrode 41 is electrically connected to the upper excitation electrode 21 via a conductor pattern 45 formed on the inner layer of the housing 30 and a conductor pattern 47 formed on the top surface of the crystal blank 10. The conductor pattern 45 is exposed from the inner layer of the housing 30 to the front surface thereof at via holes 90 and 91 in both ends; one end being electrically connected to the external electrode 41 and the other end being electrically connected to the conductor pattern 47 by a conductive adhesive 49 (see, e.g., FIG. 3A). Similarly, the external electrode 43 is electrically connected to the lower excitation electrode 22 via a conductor pattern 46 formed on the housing 30 and a conductor pattern 48 formed on the bottom surface of the crystal blank 10. The conductor pattern 46 has one end being electrically connected to the external electrode 43 via a via hole 93 and the other end being electrically connected to the conductor pattern 48 by the conductive adhesive 49. The conductive adhesive 49 is provided on the edge of the crystal blank 10 (e.g., the edge of the cantilevered side).

The sub-vibration electrode 70 includes first to fourth sub-electrodes 71 to 74. The first to fourth sub-electrodes 71 to 74 are formed on the housing 30. The first to fourth sub-electrodes 71 to 74 are formed at positions at which the sub-vibration of the crystal blank 10 may be excited. The sub-vibration will be described later.

In the example illustrated in FIGS. 1 to 3B, the first to fourth sub-electrodes 71 to 74 are formed as follows. The first to fourth sub-electrodes 71 to 74 are formed on the bottom 33 of the housing 30 (e.g., the surface of the inside of the housing 30). The first to fourth sub-electrodes 71 to 74 face the crystal blank 10 in the vertical direction. That is, the first to fourth sub-electrodes 71 to 74 overlap with the crystal blank 10 when viewed from the top. Although it is illustrated in the example illustrated in FIGS. 1 to 3B that the first to fourth sub-electrodes 71 to 74 overlap entirely with the crystal blank 10 when viewed from the top, the first to fourth sub-electrodes 71 to 74 may overlap partially with the crystal blank 10. The first sub-electrode 71 and the second sub-electrode 72 are formed with the upper excitation electrode 21 interposed therebetween in the Y direction when viewed from the top. That is, the first sub-electrode 71 and the second sub-electrode 72 are formed at positions facing the one end and the other end of the crystal blank 10 in the Y direction (see, e.g., a first region 11 and a second region 12 in FIG. 4), respectively, when viewed from the top. The third sub-electrode 73 and the fourth sub-electrode 74 are formed with the upper excitation electrode 21 interposed therebetween in the X direction when viewed from the top. That is, the third sub-electrode 73 and the fourth sub-electrode 74 are formed at positions facing the one end and the other end of the crystal blank 10 in the X direction (see, e.g., a third region 13 and a fourth region 14 in FIG. 4), respectively, when viewed from the top.

In addition, the example illustrated in FIGS. 1 to 3B, the first to fourth sub-electrodes 71 to 74 are formed such that their centers correspond to the centers of the sides of the rectangular crystal blank 10, respectively, when viewed from the top. That is, when viewed from the top, the first sub-electrode 71 and the second sub-electrode 72 are formed at the center of the crystal blank 10 in the X direction and the third sub-electrode 73 and the fourth sub-electrode 74 are formed at the center of the crystal blank 10 in the Y direction. However, the first to fourth sub-electrodes 71 to 74 may be formed such that they are biased to one side from the centers of the sides of the rectangular crystal blank 10, respectively, when viewed from the top.

The first to fourth sub-electrodes 71 to 74 are electrically connected to the external electrode 42 (e.g., one example of a second external electrode) and the external electrode 44 (e.g., one example of a first external electrode). Specifically, the first sub-electrode 71 and the second sub-electrode 72 are electrically connected to the external electrode 44, and the third sub-electrode 73 and the fourth sub-electrode 74 are electrically connected to the external electrode 42. This electrical connection method is optional.

In the example illustrated in FIGS. 1 to 3B, the first to fourth sub-electrodes 71 to 74 are electrically connected to the external electrodes 42 and 44 as follows. The first sub-electrode 71 is electrically connected to the external electrode 44 via a conductor pattern 85 (e.g., one example of a first conductor pattern) and a via hole 94, which are formed on the bottom 33 (and the inner layer) and lower surface 36 of the housing 30. The via hole 94 may be optionally formed at any position (e.g., a position immediately below the first sub-electrode 71) different from the position illustrated in FIG. 1. The second sub-electrode 72 is electrically connected to the first sub-electrode 71 via a conductor pattern 86 (e.g., one example of the first conductor pattern) formed on the bottom 33 of the housing 30. As a result, the second sub-electrode 72 is electrically connected to the external electrode 44 via the conductor pattern 86, the first sub-electrode 71, the conductor pattern 85, and the via hole 94. The third sub-electrode 73 is electrically connected to the external electrode 44 via a conductor pattern 88 (e.g., one example of a second conductor pattern) and the via hole 93, which are formed on the bottom 33 (and the inner layer) and lower surface 36 of the housing 30. The fourth sub-electrode 74 is electrically connected to the third sub-electrode 73 via a conductor pattern 87 (e.g., one example of the second conductor pattern) and via holes 95 and 96, which are formed on the inner layer of the housing 30. As a result, the fourth sub-electrode 74 is electrically connected to the external electrode 44 via the conductor pattern 87, the via holes 95 and 96, the third sub-electrode 73, the via hole 93, and the conductor pattern 88.

In addition, in the example illustrated in FIGS. 1 to 3B, the external electrode 43 and the external electrode 42 are electrically interconnected via the conductor pattern 88 and the conductor pattern 46. That is, some of the conductor pattern 88 is formed by the conductor pattern 46. However, the external electrode 43 and the external electrode 42 may be electrically isolated from each other as will be described later in Embodiment 2 (see, e.g., FIG. 14).

Figure 4:
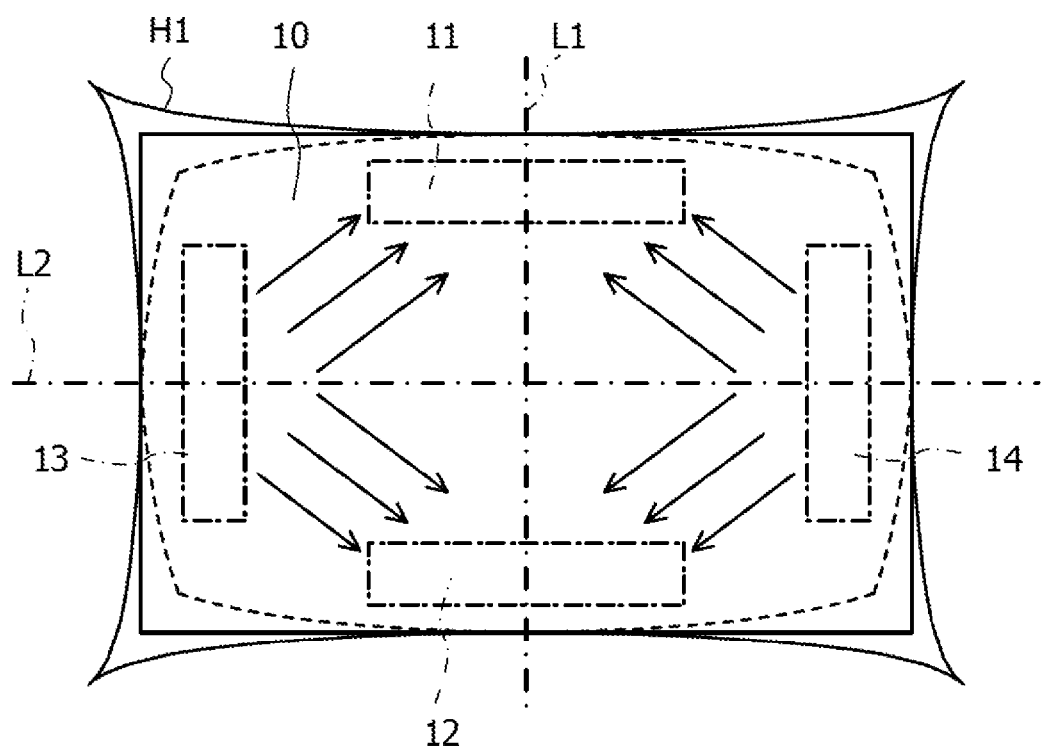
FIG. 4 is an explanatory view of sub-vibration excited by a sub-vibration electrode 70 in the crystal unit 100.

FIG. 4 is an explanatory view of the sub-vibration excited by the sub-vibration electrode 70 in the crystal unit 100, schematically illustrating only the crystal blank 10 when viewed from the top. In FIG. 4, reference numerals H1 and H2 schematically represent a change in shape (e.g., contour) of the crystal blank 10 due to a displacement by the sub-vibration. In FIG. 4, the regions 11 to 14 facing the first to fourth sub-electrodes 71 to 74, respectively, in the crystal blank 10 when viewed from the top are indicated by a dashed-dotted line. In addition, in FIG. 4, the arrows among the regions 11 to 14 represent the direction of an electric field produced among the regions 11 to 14 at certain timing in the inspection of the crystal unit 100. FIG. 4 is just schematic and it is noted that the respective positions of the regions 11 to 14 may not exactly correspond to those in FIGS. 1 to 3B.

The sub-vibration electrode 70 excites the sub-vibration of the crystal unit 100 in the inspection of the crystal unit 100. Specifically, a first sinusoidal wave signal is applied to the first sub-electrode 71 and the second sub-electrode 72, and a second sinusoidal wave signal having the opposite phase to the first signal is applied to the third sub-electrode 73 and the fourth sub-electrode 74. As a result, an alternating electric field is produced between the first sub-electrode 71 and the third sub-electrode 73, between the first sub-electrode 71 and the fourth sub-electrode 74, between the second sub-electrode 72 and the third sub-electrode 73, and between the second sub-electrode 72 and the fourth sub-electrode 74.

This electric field has an effect on the crystal blank 10 in proximity to the first to fourth sub-electrodes 71 to 74, and a separate electric field is accordingly produced in the crystal blank 10 in the direction along the substrate surface. That is, the same alternating electric field is produced between the first region 11 and the third region 13, between the first region 11 and the fourth region 14, between the second region 12 and the third region 13, and between the second region 12 and the fourth region 14. The arrows of the electric field illustrated in FIG. 4 represent the direction of the electric field under a state where a negative voltage is applied to the first sub-electrode 71 and the second sub-electrode 72 (e.g., therewith, under a state where a positive voltage is applied to the third sub-electrode 73 and the fourth sub-electrode 74).

The direction of the main electric field is oblique to the X direction (e.g., the direction of the main vibration) as illustrated in FIG. 4. That is, the main electric field direction is directed from the center of each side to the centers of adjacent sides. At this time, the crystal blank 10 is displaced in a manner illustrated in the outline H1. When an electric field is produced in the opposite direction to the electric field direction illustrated in FIG. 4, the crystal blank 10 is displaced in a manner illustrated in the outline H2. In this manner, it is possible to excite the sub-vibration of the crystal unit 100 by producing the alternating electric field among the first to fourth sub-electrodes 71 to 74. The sub-vibration of the form as illustrated in FIG. 4 involves a change in contour of the crystal blank 10 and is called a contour vibration. The support point of the crystal blank 10 (e.g., the position of the conductive adhesive 49) is preferably set on or near the nodal lines L1 and L2 of the contour vibration in order to minimize an effect of the support point on the contour vibration.

With the crystal unit 100 according to Embodiment 1 illustrated in FIGS. 1 to 3B, since the sub-vibration electrode 70 is formed on the housing 30, an electrical connection between the sub-vibration electrode 70 (e.g., the first to fourth sub-electrodes 71 to 74) and the external electrode 44 may be achieved with ease. For example, when the sub-vibration electrode is formed on the crystal blank 10, the electric connection may be achieved by means of a wire bonding. However, such electric connection may cause a complexity of wiring. As another example, when the sub-vibration electrode is formed on the crystal blank 10, the electric connection may be achieved by means of a conductive adhesive, like the excitation electrode 20 on the crystal blank 10.

However, this electric connection may have an effect on vibration characteristics of the crystal blank 10 by increasing the number of support points. For example, increasing the size of the crystal blank 10 is required to achieve desired vibration characteristics. In this respect, the crystal unit 100 according to Embodiment 1 may avoid this problem since the sub-vibration electrode 70 is formed on the housing 30. In addition, for example, the conductor patterns 85, 86, 87 and 88 according to the sub-vibration electrode 70 may be formed with the same processes as the conductor patterns 45 and 46 and the like according to the excitation electrode 20, which may result in a high productivity.

Figure 5:
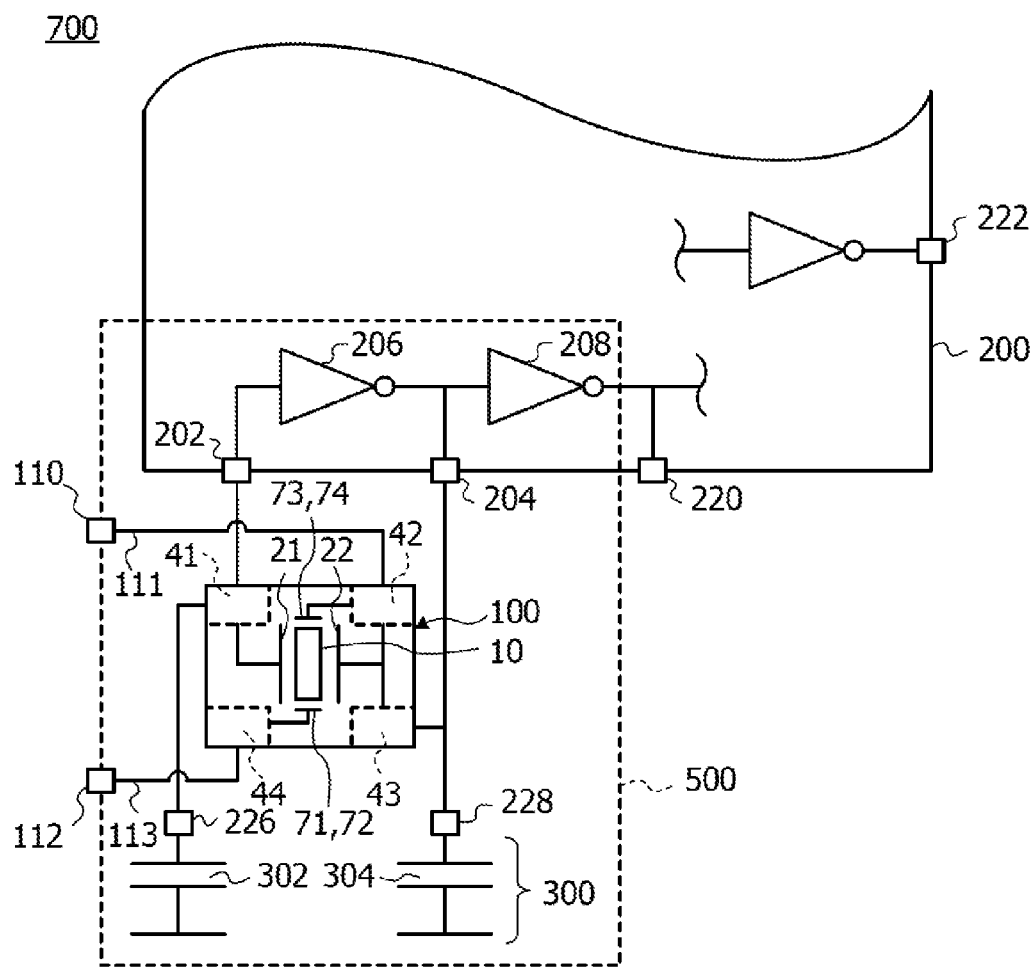
FIG. 5 is a view schematically illustrating one example of an electronic apparatus incorporating the crystal unit 100.

FIG. 5 is a view schematically illustrating one example of an electronic apparatus incorporating the crystal unit 100.

An electronic apparatus 700 includes the crystal unit 100, wirings 111 and 113 and external monitor terminals 110 and 112. The wirings 111 and 113 and the external monitor terminals 110 and 112 may be formed on a board 900 (see, e.g., FIG. 12) on which the crystal unit 100 is mounted.

In the example illustrated in FIG. 5, the electronic apparatus 700 further includes an IC 200 connected to the crystal unit 100. Specifically, the external electrodes 41 and 43 of the crystal unit 100 are connected to terminals 202 and 204 of the IC 200, respectively. The crystal unit 100 generates clocks to be used in the IC 200. The IC 200 includes an inverting amplifier 206 and an output buffer 208. A signal input to the terminal 202 is inverted and amplified by the inverting amplifier 206. The inverted and amplified signal is input to the output buffer 208 and is supplied to the upper excitation electrode 21 via the external electrode 43. In the example illustrated in FIG. 5, the upper excitation electrode 21 and the lower excitation electrode 22 may be reversely arranged.

A matching capacitor 300 is connected to the crystal unit 100. Specifically, a first capacitor 302 is connected between the external electrode 41 of the crystal unit 100 and a ground, and a second capacitor 304 is connected between the external electrode 43 of the crystal unit 100 and the ground. With respect to the IC 200, an internal capacitance of the terminals, a stray capacitance of wiring patterns of a mounting substrate, a resistor limiting a current flowing through the crystal unit 100, etc., are not illustrated in FIG. 5.

The matching capacitor 300 is provided to adjust an oscillation frequency (e.g., a matching adjustment) of the crystal unit 100 to a desired value (e.g., a designed value) when the total of capacitance (e.g., a load capacitance) including all circuit elements ranging from the crystal unit 100 to the IC 200 is assumed as a load. In FIG. 5, a range surrounded by a dotted line forms an oscillation circuit 500 pertaining to the main vibration (hereinafter referred to as "main vibration oscillation circuit 500"). The elements (e.g., the matching capacitor 300 and so on) of the main vibration oscillation circuit 500 may be mounted on the board 900 (see, e.g., FIG. 12) on which the crystal unit 100 is mounted.

The wirings 111 and 113 are connected to the crystal unit 100. The wiring 111 has one end connected to the external electrode 42 and the other end connected to an external monitor terminal 110. The wiring 113 has one end connected to the external electrode 44 and the other end connected to an external monitor terminal 112. As illustrated in FIG. 5, the wirings 111 and 113 and the external monitor terminals 110 and 112 are substantially electrically isolated from the main vibration oscillation circuit 500. The wirings 111 and 113 and the external monitor terminals 110 and 112 are used to inspect the crystal unit 100 based on the sub-vibration, which will be described later.

The IC 200 may have terminals 220 and 222 for monitoring the main vibration oscillation circuit 500. However, these terminals 220 and 222 may be omitted. This is because the crystal unit 100 may be inspected based on the sub-vibration by providing the wirings 111 and 113 and the external monitor terminals 110 and 112 in this embodiment, as will be described later.

Figure 6:
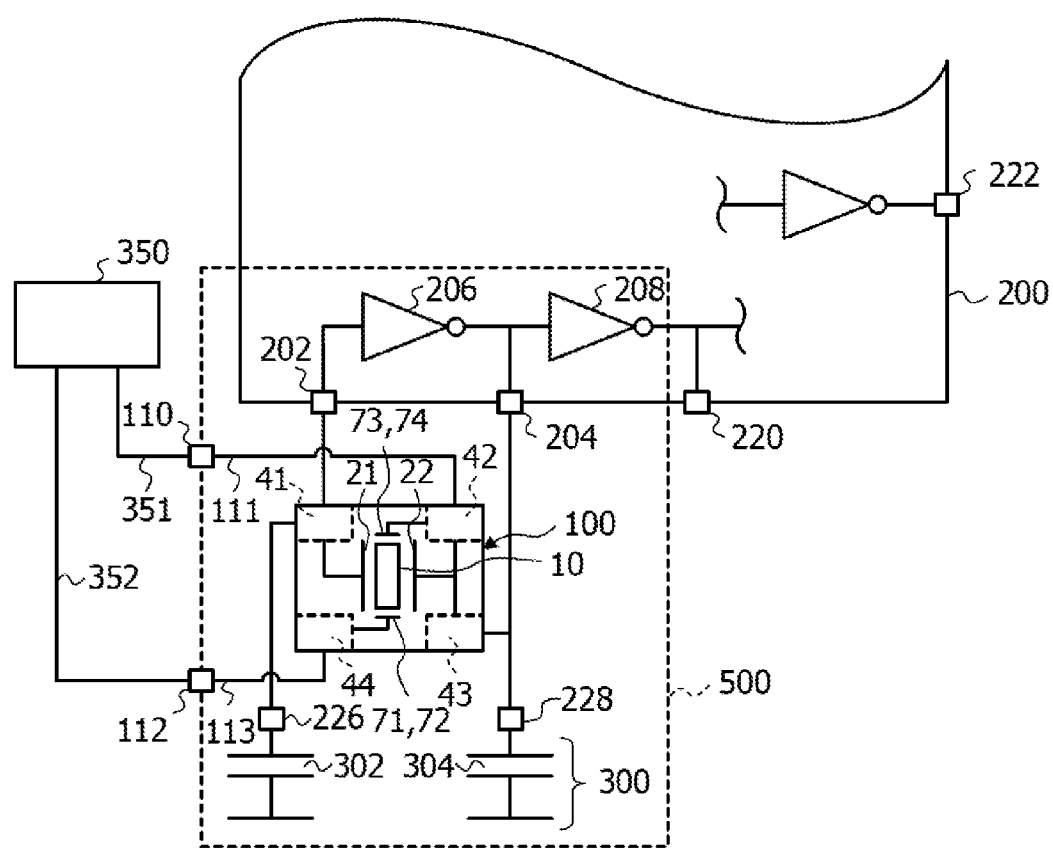
FIG. 6 is an explanatory view of a method of inspecting the crystal unit 100.

FIG. 6 is an explanatory view of a method of inspecting the crystal unit 100, schematically illustrating a state in the inspection.

The method of inspecting the crystal unit 100 to be described below may be performed under a state where the crystal unit 100 is mounted. Specifically, an analyzer 350 such as a network analyzer or a spectrum analyzer is connected to the mounted crystal unit 100, as schematically illustrated in FIG. 6. Wirings 351 and 352 are formed, for example, by applying a probe (not illustrated) to the external monitor terminals 110 and 112. To this end, the external monitor terminals 110 and 112 are set at a position where the probe may be easily applied to the terminals 110 and 112 under the state where the crystal unit 100 is mounted. If the probe may be directly and easily applied to the external electrodes 42 and 44 under the state where the crystal unit 100 is mounted, the wirings 111 and 113 and the external monitor terminals 110 and 112 may be omitted. In this case, an inspector may make an electrical connection of the analyzer 350 to the external electrodes 42 and 44 by directly applying the probe to the external electrodes 42 and 44 under the state where the crystal unit 100 is mounted.

The inspector applies an input signal from the analyzer 350 to the sub-vibration electrode 70 of the crystal unit 100 via the wirings 351 and 352 under a state where the main vibration of the crystal unit 100 is stopped. For example, as the input signal, the first sinusoidal wave signal is input via the wiring 351 and the second sinusoidal wave signal having the opposite phase to the first signal is input via the wiring 352. The state where the main vibration of the crystal unit 100 is stopped corresponds to a state where the inverting amplifier 206 is powered off.

At this time, the inspector scans (changes) the frequency of the input signal from the analyzer 350 in order to excite the sub-vibration. As a result, the inspector obtains an output for the input signal applied to the crystal unit 100 (e.g., an output obtained via the wirings 351 and 352) via the analyzer 350. The analyzer 350 outputs the frequency characteristics of impedance between the external electrodes 42 and 44 based on the output (response) obtained via the wirings 351 and 352. Thus, by connecting the analyzer 350 to the external monitor terminals 110 and 112 and applying the input signal to the crystal unit 100, it is possible to obtain the frequency characteristics of impedance between the external electrodes 42 and 44 from the external monitor terminals 110 and 112.

Figure 7:
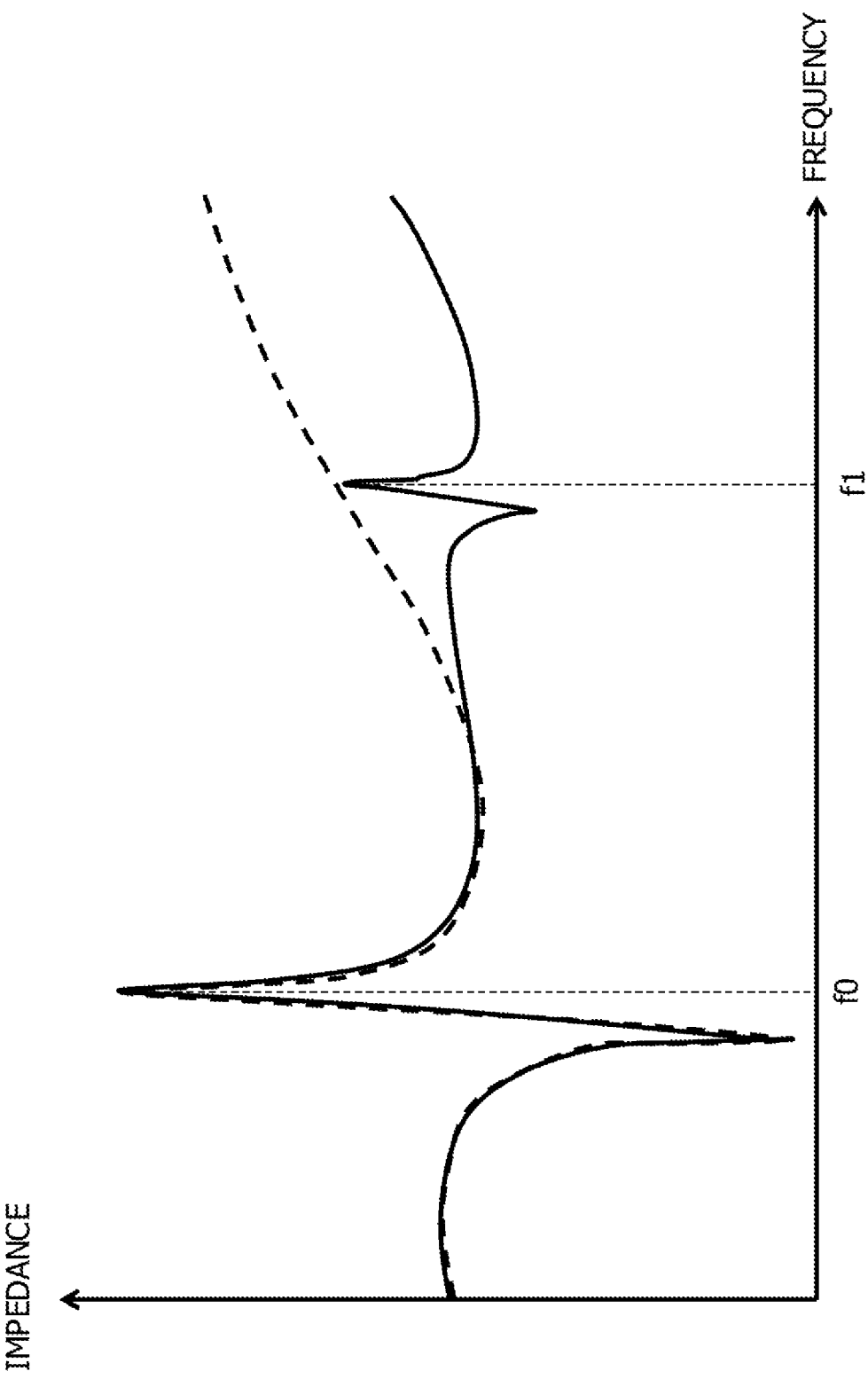
FIG. 7 is a view illustrating one example of the frequency characteristics of impedance between external electrodes 42 and 44 according to the sub-vibration.

FIG. 7 is a view illustrating one example of the frequency characteristics of impedance between the external electrodes 42 and 44 (e.g., characteristics according to the sub-vibration). In FIG. 7, as the frequency characteristics of impedance between the external electrodes 42 and 44, the frequency characteristics of impedance obtained from the external monitor terminals 110 and 112 are indicated by a broken line. In addition, in FIG. 7, as the frequency characteristics of impedance between the external electrodes 42 and 44, the characteristics in the single crystal unit 100 (hereinafter referred to as "single characteristics") are together indicated by a solid line for reference. The single characteristics of the crystal unit 100 are obtained by taking out the crystal unit 100 alone and observing it from between the external electrodes 42 and 44. The phrase "taking out the crystal unit 100 alone" as used herein means that the crystal unit 100 is not placed under a mounted state.

In the single characteristics of the crystal unit 100, as illustrated in FIG. 7, the main vibration (e.g., frequency f1) has a smaller response than the sub-vibration (e.g., frequency f2). This is because the main vibration itself is stationary although some main vibration occurs derivatively due to the input signal from the analyzer 350 (i.e., because the inverting amplifier 206 illustrated in FIG. 5 is turned off). The characteristics illustrated in FIG. 7 are illustrative only and do not necessarily have the illustrated response ratio of the sub-vibration to the main vibration.

Figure 8:
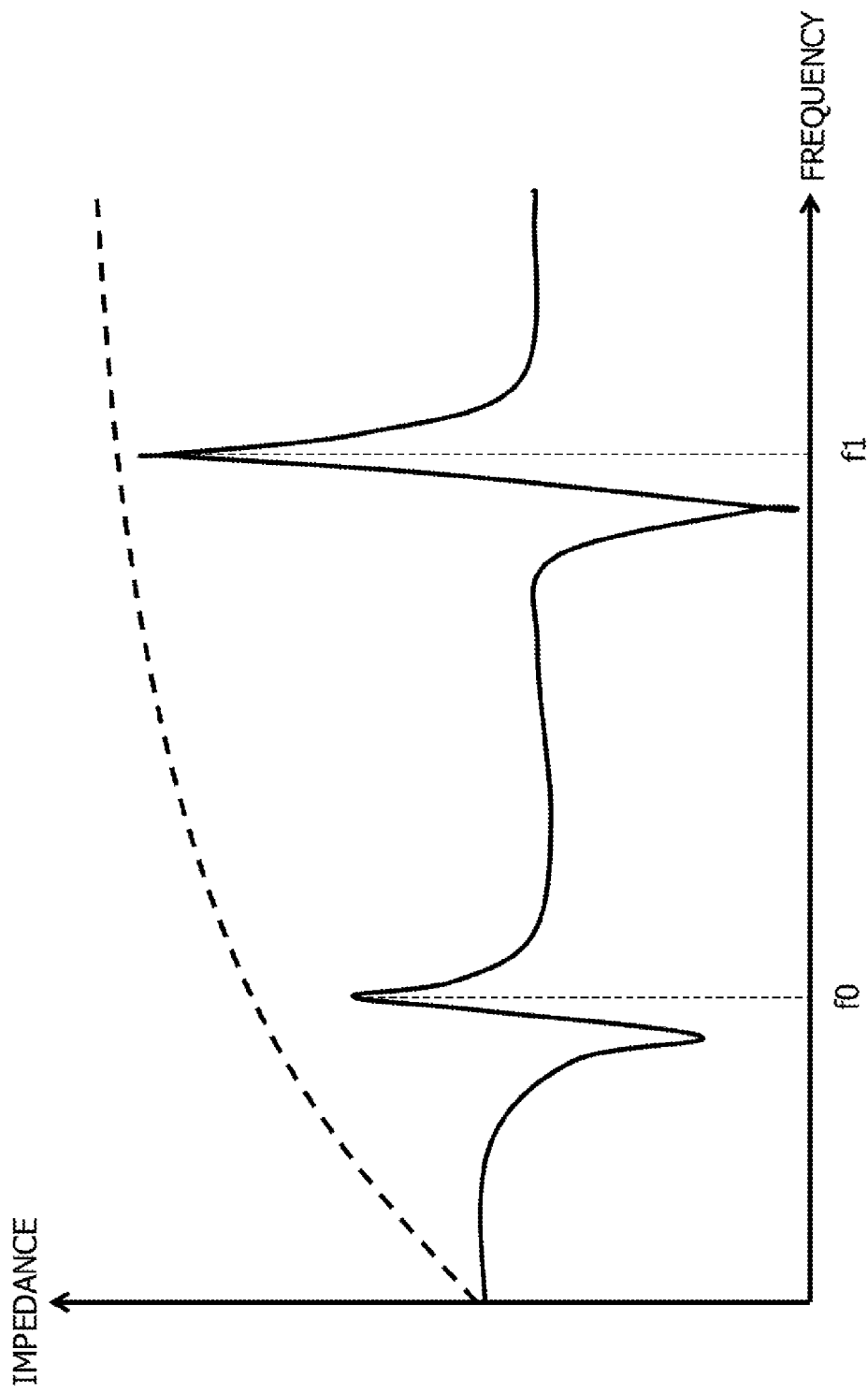
FIG. 8 is a view illustrating one example of the frequency characteristics of impedance between external electrodes 41 and 43 according to main vibration.

FIG. 8 is a view illustrating one example of the frequency characteristics of impedance between the external electrodes 41 and 43 (e.g., the characteristics according to the main vibration), for comparison. In FIG. 8, as the frequency characteristics of impedance between the external electrodes 41 and 43, the frequency characteristics of impedance obtained from the terminals 202 and 204 (or the terminals 226 and 228) are indicated by a broken line. In addition, in FIG. 8, as the frequency characteristics of impedance between the external electrodes 41 and 43, the single characteristics of the single crystal unit 100 are together indicated by a solid line for reference. The single characteristics of the crystal unit 100 are obtained by taking out the crystal unit 100 alone and observing it from between the external electrodes 41 and 43.

In the single characteristics of the crystal unit 100, in comparison with the same single characteristics according to the sub-vibration illustrated in FIG. 7, the sub-vibration (e.g., frequency f2) has a smaller response than the main vibration (e.g., frequency f1). Although the frequency characteristics of impedance obtained from the terminals 202 and 204 (or the terminals 226 and 228) may be obtained under the state where the crystal unit 100 is mounted, it is not possible to observe a definite response that may be observed with the single characteristics, as illustrated in FIG. 8. This is because the impedance between the terminals 202 and 204 (or the terminals 226 and 228) of the crystal unit includes not only the capacitance of the crystal unit 100 but also the capacitance of the matching capacitor 300, the IC internal capacitance (not illustrated), and the substrate stray capacitance (not illustrated).

In this respect, the external monitor terminals 110 and 112 (and the external electrodes 42 and 44) according to the sub-vibration are not substantially and electrically connected to the main vibration oscillation circuit 500 (see, e.g., FIG. 5). Accordingly, the impedance between the external monitor terminals 110 and 112 corresponds to the sum of the single characteristics of the crystal unit 100 and some substrate stray capacitance. Accordingly, the impedance characteristics close to the single characteristics of the crystal unit 100 may be obtained from the external monitor terminals 110 and 112. However, in the frequency characteristics of impedance obtained from the external monitor terminals 110 and 112 (see, e.g., the broken line in FIG. 7), it is difficult to observe a response according to the main vibration as compared to the single characteristics of the crystal unit 100 (see, e.g., the solid line in FIG. 7). This is attributed to a relatively small response of the main vibration in the single characteristics of the crystal unit 100 (see, e.g., the solid line in FIG. 7), the substrate stray capacitance and the like. In the meantime, as may be seen from FIG. 7, a response of the sub-vibration may be still observed.

In this way, according to this embodiment, as the frequency characteristics of impedance between the external electrodes 42 and 44 according to the sub-vibration, the impedance characteristics close to the single characteristics of the crystal unit 100 may be obtained from the external monitor terminals 110 and 112 under the state where the crystal unit 100 is mounted. This allows the crystal unit 100 to be inspected under the state where the crystal unit 100 is mounted.

Figure 9:
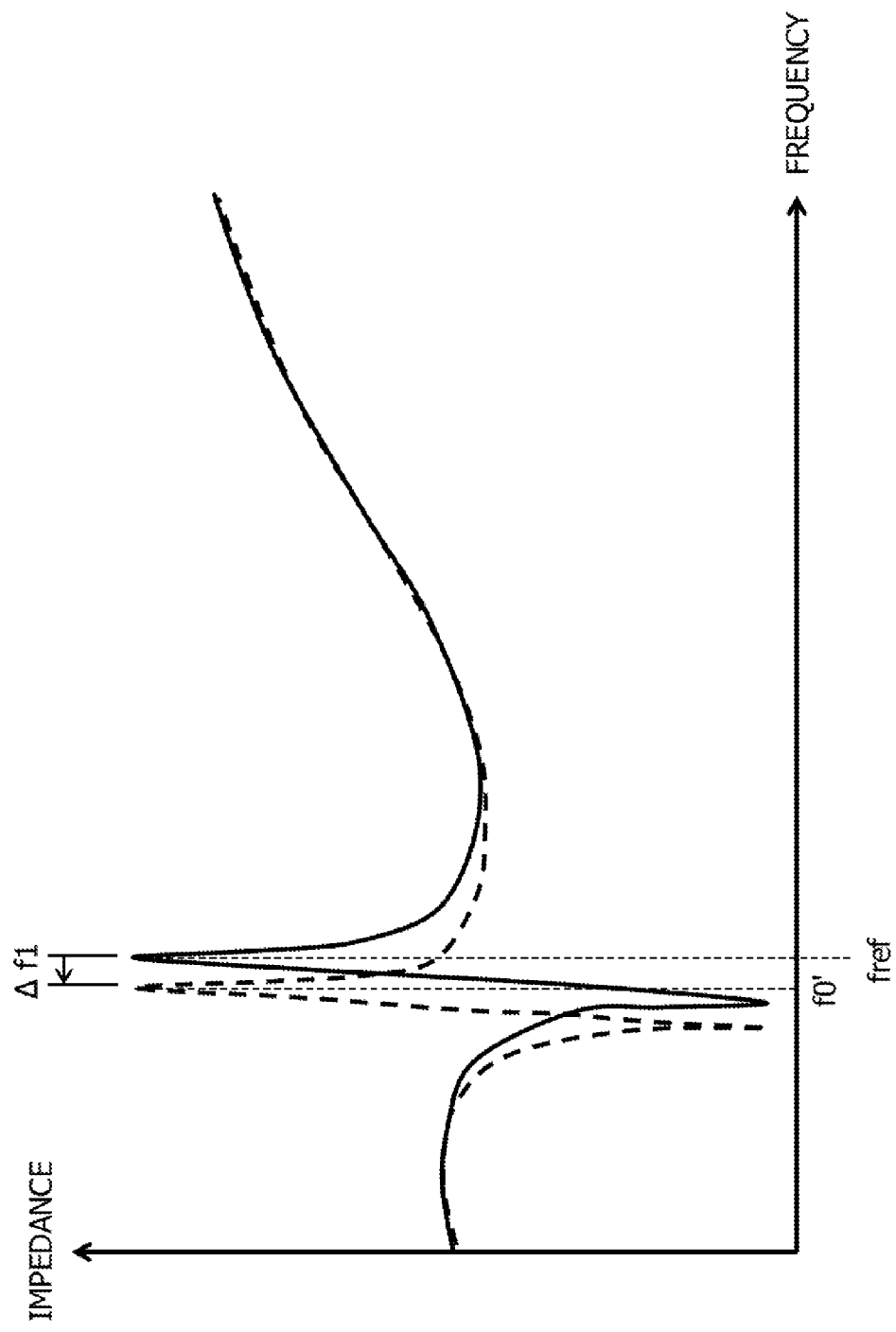
FIG. 9 is a view illustrating one example of the frequency characteristics of impedance between the external electrodes 42 and 44 under the presence of defects.

FIG. 9 is a view illustrating one example of the frequency characteristics of impedance between the external electrodes 42 and 44 under the presence of defects. In FIG. 9, one example of the frequency characteristics when the crystal unit 100 is deteriorated with time is indicated by a dotted line and the same characteristics of the crystal unit 100 in a non-deteriorated state is indicated by a solid line. The frequency characteristics of impedance illustrated in FIG. 9 may be obtained from the external monitor terminals 110 and 112.

If the crystal unit 100 is deteriorated with time, the peak frequency according to the sub-vibration tends to be lower than the same peak frequency in the non-deteriorated state, as illustrated in FIG. 9. In the example illustrated in FIG. 9, the peak frequency according to the sub-vibration is decreased by $\Delta f1$ due to the deterioration with time. However, if the crystal unit 100 is deteriorated with time, the response according to the sub-vibration (e.g., peak value) tends not to be substantially changed as compared to the same response in the non-deteriorated state, as illustrated in FIG. 9. Accordingly, it is possible to determine the presence or absence of the time deterioration of the crystal unit 100 by determining the presence or absence of this tendency based the frequency characteristics of impedance between the external electrodes 42 and 44 obtained from the external monitor terminals 110 and 112 in the inspection.

For example, assuming that the peak frequency according to the sub-vibration in the non-deteriorated state is a reference frequency fref, the peak frequency according to the sub-vibration obtained under inspection (hereinafter referred to as "under-inspection peak frequency f0") is compared with the reference frequency fref. Based on this comparison, it is possible to determine the time deterioration of the crystal unit 100. In this case, the reference frequency fref may be determined based on the peak frequency of a different individual (e.g., an average of peak frequencies for more different individuals) in the non-deteriorated state or may be determined based on the peak frequency of the same individual in the non-deteriorated state.

For example, if the under-inspection peak frequency f0' is lower than the reference frequency fref by a first predetermined threshold or higher, the inspector may determine that the crystal unit 100 is defective. The first predetermined threshold may be adapted by a test or the like. At this time, the inspector may compare the response according to the sub-vibration obtained under inspection (hereinafter referred to as "under-inspection response I0'") with a reference value Iref. Similarly, the reference value Iref may be determined based on the response of a different individual (e.g., an average of responses for more different individuals) in the non-deteriorated state or may be determined based on the response of the same individual in the non-deteriorated state.

For example, if the under-inspection peak frequency f0' is lower than the reference frequency fref by the first predetermined threshold or higher and the under-inspection response I0' is not lower than the reference value Iref by a second predetermined threshold or higher, it may be determined that the crystal unit 100 is deteriorated with time. The second predetermined threshold is used to detect defects attributed to adhesion of alien substances as described later and may be adapted by a test or the like.

The determination on the presence or absence, or form of the above-mentioned defects (e.g., time deterioration) may be achieved by visual inspection of the inspector (e.g., comparison between data) or automatically achieved (e.g., by a program installed in a processor). This is equally applied to different forms of defects as described later.

Figure 10:
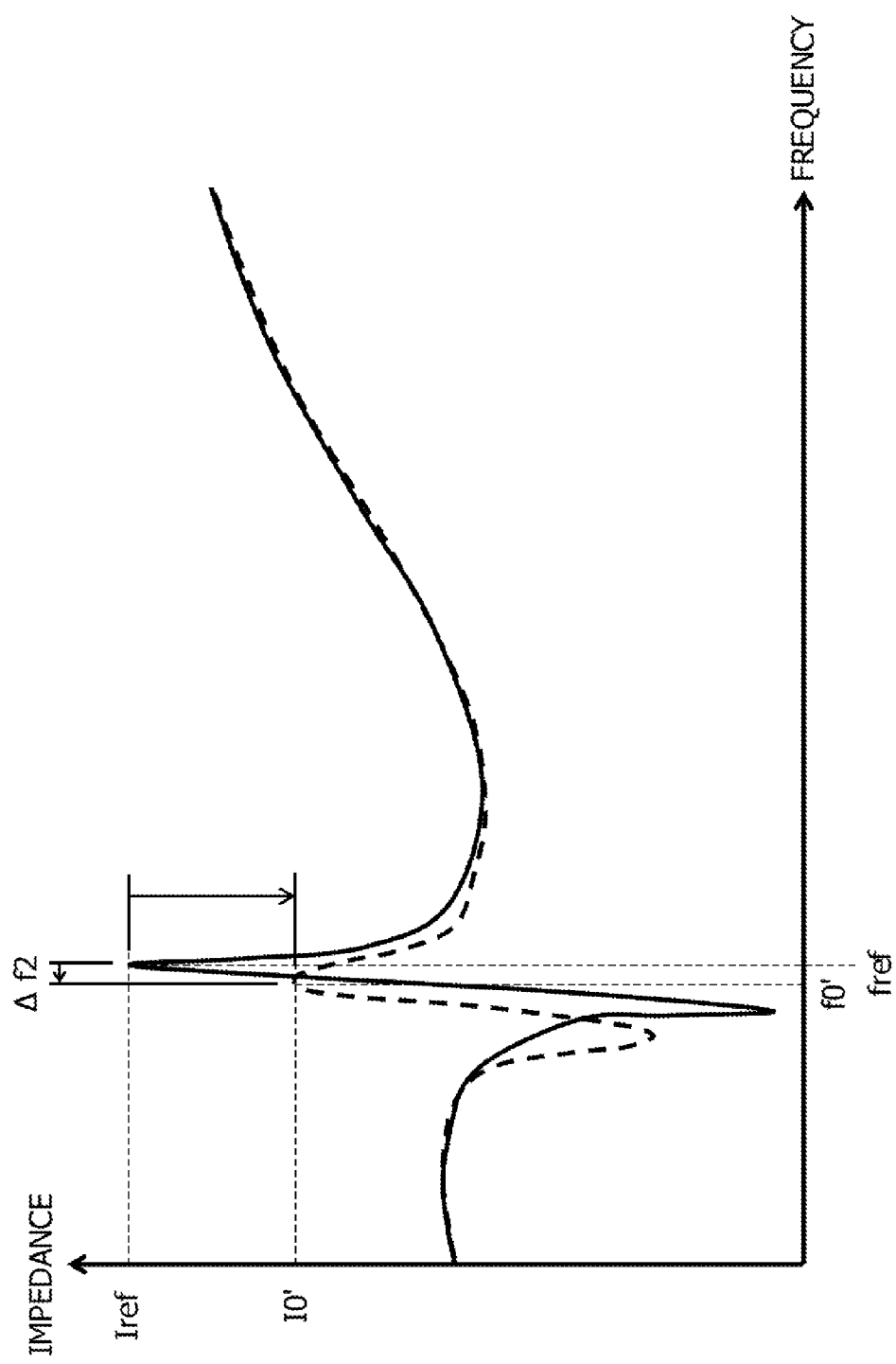
FIG. 10 is a view illustrating another example of the frequency characteristics of impedance between the external electrodes 42 and 44 under the presence of defects.

FIG. 10 is a view illustrating another example of the frequency characteristics of impedance between the external electrodes 42 and 44 under the presence of defects. In FIG. 10, one example of the frequency characteristics when alien substances are adhered to the crystal blank 10 of the crystal unit 100 is indicated by a dotted line and the same characteristics of the crystal unit 100 in the non-deteriorated state are indicated by a solid line. The frequency characteristics of impedance illustrated in FIG. 10 may be obtained from the external monitor terminals 110 and 112.

If alien substances are adhered to the crystal blank 10, the peak frequency according to the sub-vibration tends to be lower than the same peak frequency in the non-deteriorated state, as illustrated in FIG. 10. In the example illustrated in FIG. 10, the peak frequency according to the sub-vibration is decreased by $\Delta f2$ due to the adhesion of alien substances. In addition, if the alien substances are adhered to the crystal blank 10, the response according to the sub-vibration (e.g., a peak value) tends to be lower than the same response in the non-deteriorated state, as illustrated in FIG. 10. In the example illustrated in FIG. 10, the response according to the sub-vibration is decreased by $\Delta I$ due to the adhesion of alien substances. Accordingly, it is possible to determine the presence or absence of alien substances adhered to the crystal blank 10 by determining the presence or absence of this tendency based the frequency characteristics of impedance between the external electrodes 42 and 44 obtained from the external monitor terminals 110 and 112 in the inspection.

For example, the determination on the presence or absence of alien substances adhered to the crystal blank 10 may be made by comparing the reference frequency fref with the under-inspection peak frequency f0' and comparing the under-inspection response I0' with the reference value Iref. For example, if the under-inspection peak frequency f0' is lower than the reference frequency fref by a third predetermined threshold or higher and the under-inspection response I0' is lower than the reference value Iref by the second predetermined threshold or higher, the inspector may determine that alien substances are adhered to the crystal blank 10. The third predetermined threshold may be adapted by a test or the like.

Figure 11:
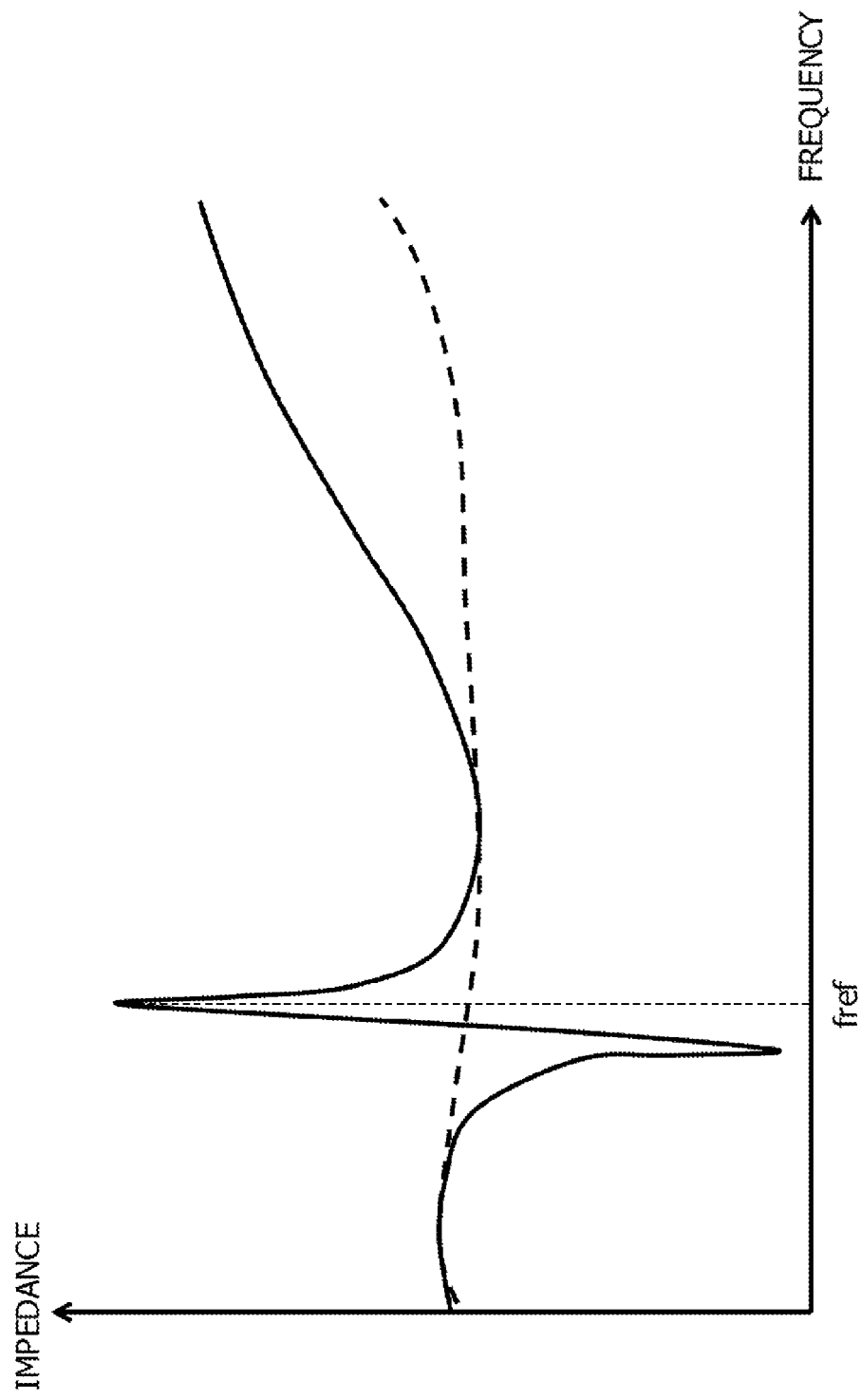
FIG. 11 is a view illustrating another example of the frequency characteristics of impedance between the external electrodes 42 and 44 under the presence of defects.

FIG. 11 is a view illustrating another example of the frequency characteristics of impedance between the external electrodes 42 and 44 under the presence of defects. In FIG. 11, one example of the frequency characteristics when the crystal blank 10 of the crystal unit 100 is damaged is indicated by a dotted line and the same characteristics of the crystal unit 100 in the non-deteriorated state are indicated by a solid line. The frequency characteristics of impedance illustrated in FIG. 11 may be obtained from the external monitor terminals 110 and 112.

If the crystal blank 10 is damaged, the impedance tends to be low over the entire frequency range, as illustrated in FIG. 11. Accordingly, it is possible to determine the presence or absence of damage of the crystal blank 10 by determining the presence or absence of this tendency based the frequency characteristics of impedance between the external electrodes 42 and 44 obtained from the external monitor terminals 110 and 112 in the inspection.

For example, the determination on the presence or absence of damage of the crystal blank 10 may be made based on the presence or absence of the under-inspection peak frequency f0' and the under-inspection response I0'. Specifically, if the under-inspection peak frequency f0' and the under-inspection response I0' may not be specified, the inspector may determine that the crystal blank 10 is damaged. Alternatively or equivalently, if the impedance obtained in the inspection is equal to or lower than a fourth predetermined threshold over the entire frequency range, the inspector may determine that the crystal blank 10 is damaged. The fourth predetermined threshold may be adapted by a test or the like.

In this way, according to this embodiment, based on the frequency characteristics of impedance between the external electrodes 42 and 44 obtained from the external monitor terminals 110 and 112 in the inspection, it is possible to determine the presence or absence of time deterioration of the crystal unit 100, the presence or absence of alien substances adhered to the crystal unit 100 and the presence or absence of damage of the crystal unit 100.

In addition, although the determination on the presence or absence, or form of the above-mentioned defects (e.g., time deterioration and so on) is made based on the determination on whether or not values (e.g., f0' and I0') in the inspection are deviated from the corresponding reference values (e.g., fref and Iref) by the corresponding predetermined thresholds or higher, the present disclosure is not limited thereto.

For example, equivalently, the determination on the presence or absence, or form of the above-mentioned defects (e.g., time deterioration and so on) may be made based on the determination on whether or not the values (e.g., f0' and I0') in the inspection fall within the corresponding reference ranges. Alternatively, the determination on the presence or absence, or form of the above-mentioned defects (e.g., time deterioration and so on) may be made by comparing the frequency characteristics of impedance between the external electrodes 42 and 44 obtained from the external monitor terminals 110 and 112 in the inspection with the frequency characteristics of impedance serving as a reference. The frequency characteristics of impedance serving as a reference may be the frequency characteristics of different individuals in the non-deteriorated state or the frequency characteristics of the same individuals in the non-deteriorated state.

In recent years, in an effort to meet the requirements of reduction in device size, compactness and high-density packaging of parts and modules are in progress. With no exception, the downsizing of the crystal units serving as clock sources have also been in progress with the sizes of, for example, 3.2×2.5 mm, 2.5×2.0 mm and 2.0×1.6 mm. Under such circumstances, when it is considered that a function failure has occurred in a device due to an abnormality of a crystal unit, it is useful to provide the ability to inspect the crystal unit in a state where it is packaged into the device. This is because taking out and inspecting only the crystal unit 100 in a high-density packaging involves a risk of damaging peripheral parts when the crystal unit 100 is removed from the device.

Figure 12:
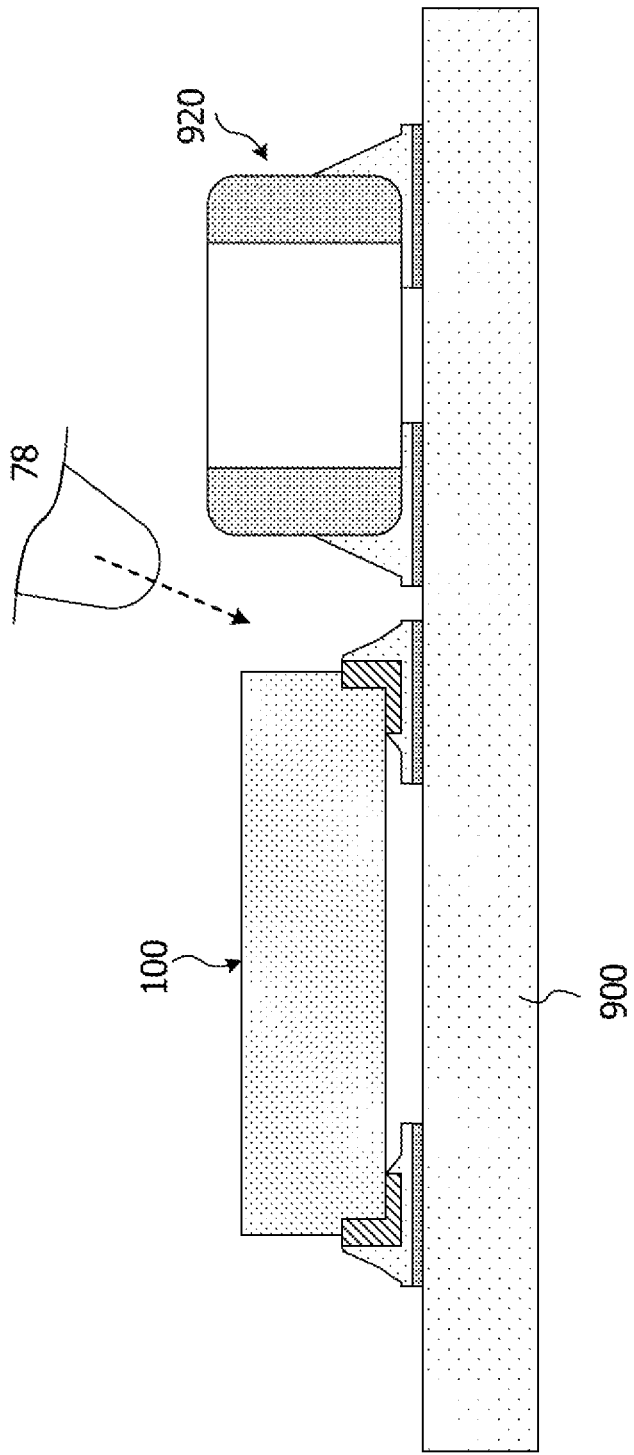
FIG. 12 is a view illustrating one example of a state where the crystal unit 100 is mounted.

In this respect, probe inspection of high impedance may be possible in the state where the crystal unit 100 is mounted. However, with recent compactness, in some cases, terminals (see, e.g., the terminals 220 and 222 in FIG. 12) through which an oscillation state may be identified may not be contained in the IC 200 or may be hidden in the back side of the IC package by Ball Grid Array (BGA). In addition, in some cases, there may be states where no probing point is present, such as incorporating the matching capacitor 300 in the IC 200, forming terminals in the back side of the crystal unit 100, etc. In addition, in some cases, with advance of high-density packaging, there may be no place to which a probe 78 is to be physically applied, as schematically illustrated in FIG. 12. In the example illustrated in FIG. 12, the crystal unit 100 is mounted on a board (e.g., a mother board) 900, together with ambient peripheral parts 920.

In this respect, according to the inspection method of this embodiment, as described above, even if the probe inspection using the terminals 220 and 222 and so on is impossible or difficult, it is possible to inspect the crystal unit 100 with high precision. In addition, according to the inspection method of this embodiment, it is possible to inspect a state of the single crystal blank 10 with higher precision than an inspection method based on an output from the terminals 220 and 222. This is because characteristics of elements (e.g., such as the IC 200, the matching capacitor 300 and the like) other than the crystal blank 10 are superimposed on the output from the terminals 220 and 222 (see, e.g., the broken line in FIG. 8) whereas such characteristics are not superimposed on the output from the external monitor terminals 110 and 112.

Next, another inspection method which does not use the analyzer 350 will be described with reference to FIG. 13.

Figure 13:
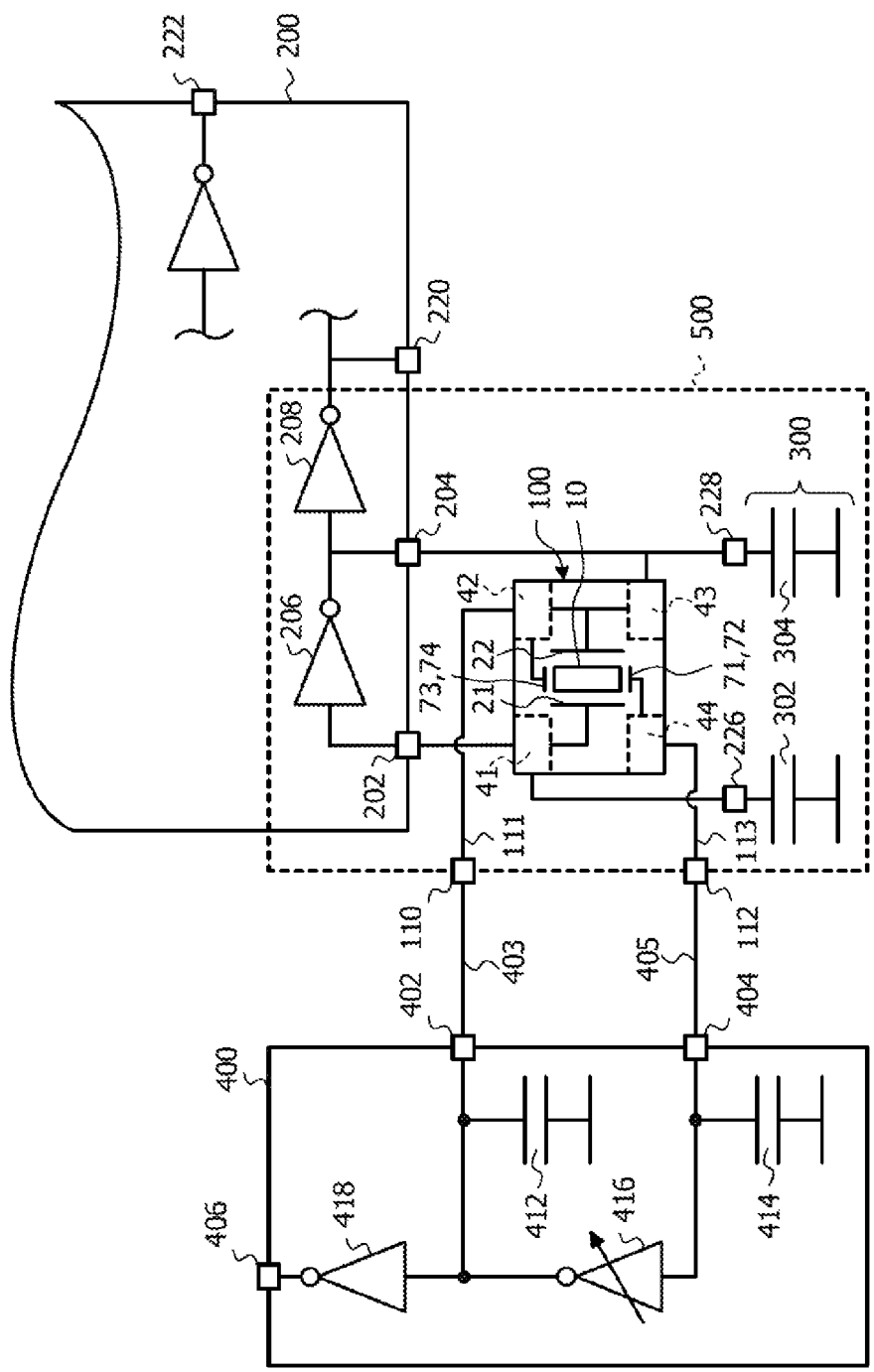
FIG. 13 is an explanatory view of another method of inspecting the crystal unit 100.

FIG. 13 is an explanatory view of another method of inspecting the crystal unit 100, schematically illustrating a state of the crystal unit 100 in inspection.

Another method of inspecting the crystal unit 100 as described below may be performed under the state where the crystal unit 100 is mounted. Specifically, as schematically illustrated in FIG. 13, a sub-vibration oscillation circuit 400 is connected to the mounted crystal unit 100 via wirings 403 and 405. The wirings 403 and 405 to external terminals 402 and 404 of the sub-vibration oscillation circuit 400 are formed, for example by applying a probe (not illustrated) to the external monitor terminals 110 and 112. In addition, like the inspection method described above with reference to FIG. 6, if the probe may be directly easily applied to the external electrodes 42 and 44 under the state where the crystal unit 100 is mounted, the wirings 111 and 113 and the external monitor terminals 110 and 112 may be omitted. In this case, an inspector may make electrical connection of the sub-vibration oscillation circuit 400 to the external electrodes 42 and 44 by directly applying the probe to the external electrodes 42 and 44 under the state where the crystal unit 100 is mounted.

The sub-vibration oscillation circuit 400 includes substantially the same elements as the main vibration oscillation circuit 500. Specifically, the sub-vibration oscillation circuit 400 includes matching capacitors 412 and 414, an inverting amplifier 416 and an output buffer 418. The inverting amplifier 416 may be a variable gain amplifier as illustrated in FIG. 13. The sub-vibration oscillation circuit 400 further includes external terminals 402, 404 and 406.

An inspector applies an input signal (noise) to the sub-vibration electrode 70 via the wiring 403 by powering on the inverting amplifier 416 of the sub-vibration oscillation circuit 400 under a state where the main vibration of the crystal unit 100 is stopped. As a result, the sub-vibration of the crystal unit 100 is excited. The inspector may obtain an output for the input signal, which is applied to the crystal unit 100, via an external terminal 406. An output waveform (e.g., pulse waveform) according to the sub-vibration of the crystal unit 100 is output from the external terminal 406. The frequency of the output waveform is a frequency according to the sub-vibration and corresponds to the above-described under-inspection peak frequency f0'.

Accordingly, the inspector may determine the presence or absence of defects of the crystal unit 100, like the inspection method described above with reference to FIG. 6, by comparing the frequency of the output waveform with the reference frequency fref. In addition, the frequency of the output waveform from the external terminal 406 may be specified, for example by a frequency counter. In this way, the inspector may inspect the crystal unit 100 by connecting the sub-vibration oscillation circuit 400 to the external monitor terminals 110 and 112 and exciting the sub-vibration of the crystal unit 100.

In addition, in the inspection method illustrated in FIG. 13, the inspector may create an over-excited state by increasing the gain of the inverting amplifier 416 and make a change in vibration state (e.g., such as normal oscillation). This may be effective particularly when the form of defects is adhesion of alien substances since the alien substances may be removed by the over-excitation.

Next, a crystal unit 102 according to another embodiment (Embodiment 2) will be described. The crystal unit 102 according to Embodiment 2 may have substantially the same configuration as the crystal unit 100 according to the above-described Embodiment 1 except for the electrical connection between the sub-vibration electrode 70 and the external electrodes 42 and 44. In Embodiment 2, the same elements as the crystal unit 100 according to the above-described Embodiment 1 are denoted by the same reference numerals and explanation of which will not be repeated.

Figure 14:
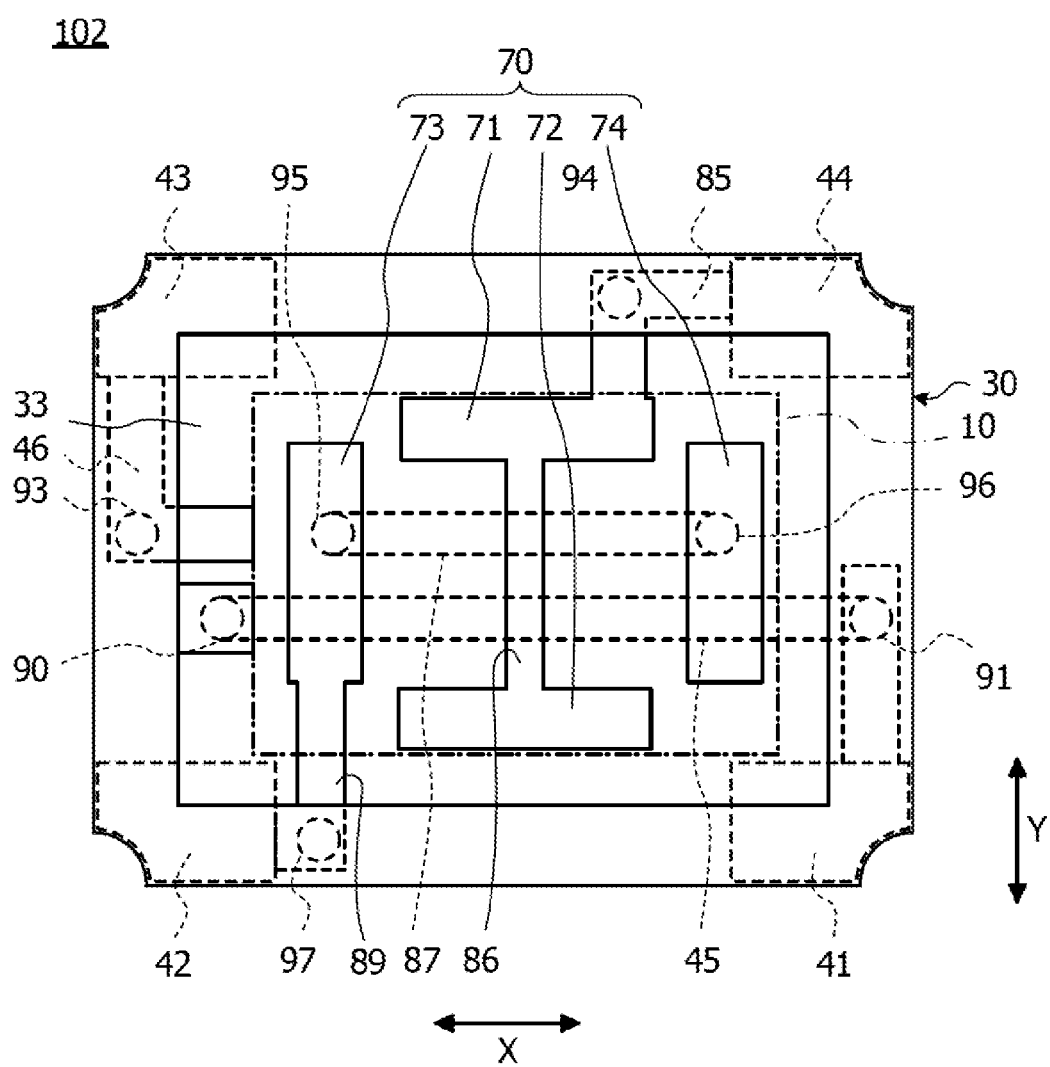
FIG. 14 is a top view schematically illustrating a crystal unit 102 according to another embodiment (Embodiment 2)

FIG. 14 is a top view schematically illustrating the crystal unit 102 according to another embodiment (Embodiment 2). In FIG. 14, as in FIG. 1, a cover of a housing 30 is not illustrated to allow the interior of the housing 30 to be visible. In FIG. 14, with regard to a crystal blank 10 and an excitation electrode 20, only the contour of the crystal blank 10 is indicated by a dashed-dotted line to allow the bottom of the housing 30 to be visible.

The crystal unit 102 includes the crystal blank 10, the excitation electrode 20, the housing 30, external electrodes 41 to 44, and a sub-vibration electrode 70.

In the example illustrated in FIG. 14, unlike the example illustrated in FIGS. 1 to 3B, the third sub-electrode 73 is electrically connected to the external electrode 44 via a conductor pattern 89 (e.g., one example of the second conductor pattern) and a via hole 97, which are formed on the bottom 33 (and the inner layer) and lower surface 36 of the housing 30. Accordingly, in the example illustrated in FIG. 14, unlike the example illustrated in FIGS. 1 to 3B, the external electrode 43 and the external electrode 42 are electrically isolated from each other. That is, in the example illustrated in FIG. 14, the third sub-electrode 73 and the fourth sub-electrode 74 are electrically connected to the external electrode 42 in such a manner that these sub-electrodes 73 and 74 are electrically isolated from the conductor pattern 46.

Figure 15:
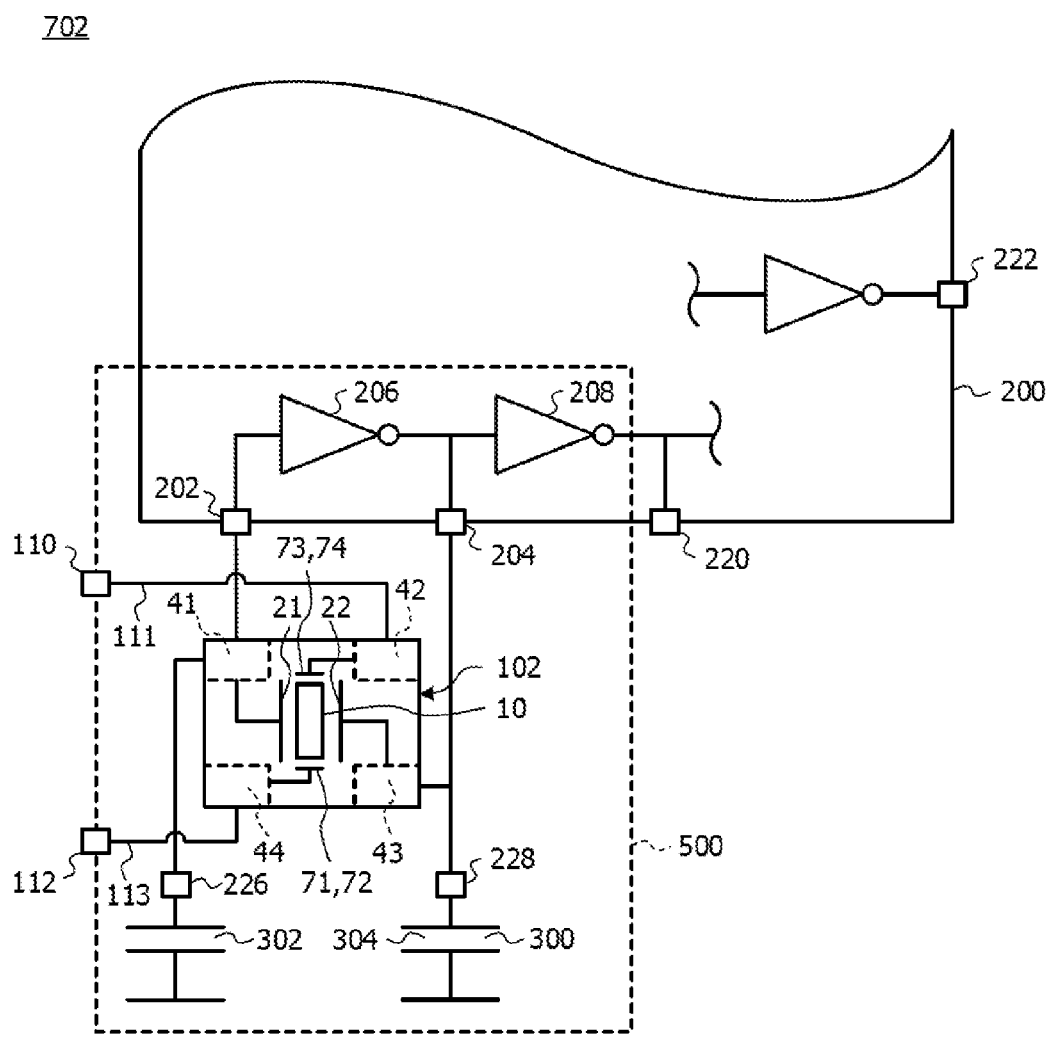
FIG. 15 is a view schematically illustrating one example of an electronic apparatus incorporating the crystal unit 102.

FIG. 15 is a view schematically illustrating one example of an electronic apparatus incorporating the crystal unit 102. An electronic apparatus 702 illustrated in FIG. 15 has substantially the same configuration as the electronic apparatus 700 illustrated in FIG. 5 except that the crystal unit 100 is replaced with the crystal unit 102.

This Embodiment 2 may achieve the same effects as the above-described Embodiment 1.

Next, a crystal unit 103 according to another embodiment (Embodiment 3) will be described. The crystal unit 103 according to Embodiment 3 has substantially the same configuration as the crystal unit 102 according to the above-described Embodiment 2 except for the electrical connection between the sub-vibration electrode 70 and the external electrodes 42 and 44. In Embodiment 3, the same elements as the crystal unit 102 according to the above-described Embodiment 2 are denoted by the same reference numerals and explanation of which will not be repeated.

Figure 16:
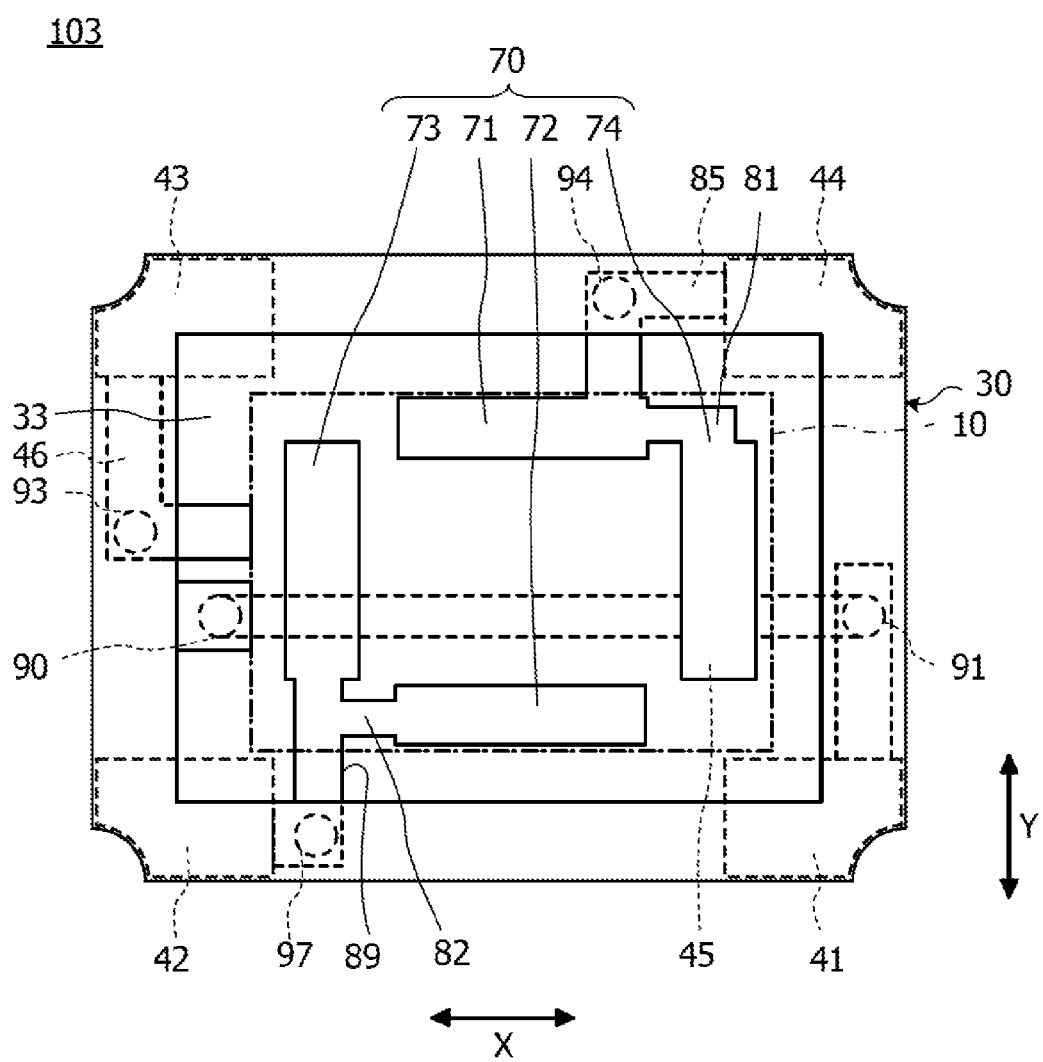
FIG. 16 is a top view schematically illustrating a crystal unit 103 according to another embodiment (Embodiment 3)

FIG. 16 is a top view schematically illustrating the crystal unit 103 according to another embodiment (Embodiment 3). In FIG. 16, as in FIG. 14, a cover of a housing 30 is not illustrated to allow the interior of the housing 30 to be visible. In FIG. 16, with regard to a crystal blank 10 and an excitation electrode 20, only the contour of the crystal blank 10 is indicated by a dashed-dotted line to allow the bottom of the housing 30 to be visible.

The crystal unit 103 includes the crystal blank 10, the excitation electrode 20, the housing 30, external electrodes 41 to 44, and a sub-vibration electrode 70.

In the example illustrated in FIG. 16, the conductor patterns 86 and 87 and the via holes 95 and 96 are excluded from the example illustrated in FIG. 14, while a conductor pattern 81 (one example of the first conductor pattern) and a conductor pattern 82 (e.g., one example of the second conductor pattern) are added to the example illustrated in FIG. 14.

The conductor pattern 81 is formed on the bottom 33 of the housing 30 and is electrically connected to the first sub-electrode 71 and the fourth sub-electrode 74. The conductor pattern 82 is formed on the bottom 33 of the housing 30 and is electrically connected to the second sub-electrode 72 and the third sub-electrode 73. Accordingly, in the example illustrated in FIG. 16, unlike the example illustrated in FIG. 14, the first sub-electrode 71 and the fourth sub-electrode 74 are electrically connected to the external electrode 44, and the second sub-electrode 72 and the third sub-electrode 73 are electrically connected to the external electrode 42. Alternatively, unlike the example illustrated in FIG. 16, the first sub-electrode 71 and the third sub-electrode 73 may be electrically connected to the external electrode 44, and the second sub-electrode 72 and the fourth sub-electrode 74 may be electrically connected to the external electrode 42. In addition, although the conductor pattern 82 is electrically connected to the conductor pattern 89 in the example illustrated in FIG. 16, the conductor pattern 82 may be directly and electrically connected to the third sub-electrode 73.

Figure 17:
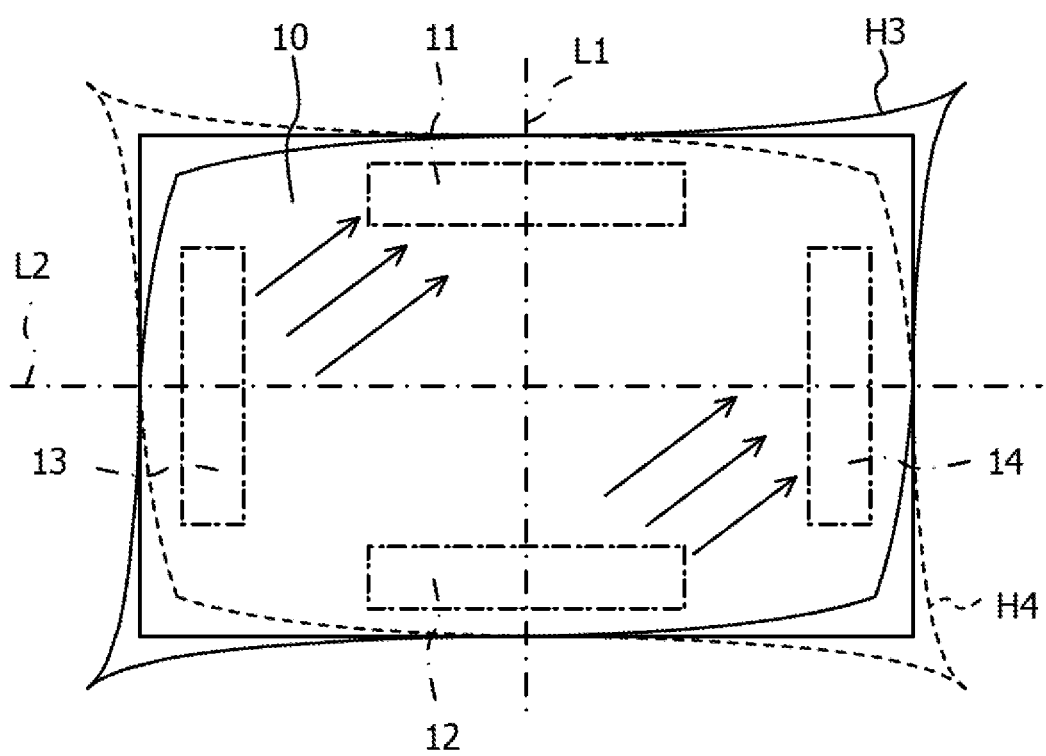
FIG. 17 is an explanatory view of sub-vibration excited by a sub-vibration electrode 70 in the crystal unit 103.

FIG. 17 is an explanatory view of sub-vibration excited by the sub-vibration electrode 70 in the crystal unit 103, schematically illustrating only the crystal blank 10 when viewed from the top. In FIG. 17, reference numerals H3 and H4 schematically represent a change in shape (e.g., contour) of the crystal blank 10 caused by a displacement by the sub-vibration. In FIG. 17, the regions 11 to 14 facing the first to fourth sub-electrodes 71 to 74, respectively, in the crystal blank 10 are indicated by a dashed-dotted line. In addition, in FIG. 17, the arrows among the regions 11 to 14 represent the direction of an electric field produced among the regions 11 to 14 at certain timing in the inspection of the crystal unit 103. FIG. 17 is just schematic and it is noted that the respective positions of the regions 11 to 14 may not exactly correspond to those in FIG. 16.

The sub-vibration electrode 70 excites the sub-vibration of the crystal unit 103 in the inspection of the crystal unit 103. Specifically, a first sinusoidal wave signal is applied to the first sub-electrode 71 and the fourth sub-electrode 74, and a second sinusoidal wave signal having the opposite phase to the first signal is applied to the second sub-electrode 72 and the third sub-electrode 73. As a result, an alternating electric field is produced between the first sub-electrode 71 and the third sub-electrode 73, and between the second sub-electrode 72 and the fourth sub-electrode 74. This electric field has an effect on the crystal blank 10 in proximity to the first to fourth sub-electrodes 71 to 74, and a separate electric field is accordingly produced in the crystal blank 10 in the direction along the substrate surface. That is, the same alternating electric field is produced between the first region 11 and the third region 13 and between the second region 12 and the fourth region 14.

The arrows of the electric field illustrated in FIG. 17 represent the direction of the electric field under a state where a negative voltage is applied to the first sub-electrode 71 and the fourth sub-electrode 74 (e.g., therewith, under a state where a positive voltage is applied to the second sub-electrode 72 and the third sub-electrode 73). The direction of the main electric field is oblique to the X direction (e.g., the direction of the main vibration) as illustrated in FIG. 17. That is, the main electric field direction is directed from the centers of sides according to the second region 12 and the third region 13 to the centers of sides the fourth region 14 and the first region 11, respectively. At this time, the crystal blank 10 is displaced in a manner illustrated in the outline H3. When an electric field is produced in the opposite direction to the electric field direction illustrated in FIG. 17, the crystal blank 10 is displaced in a manner illustrated in the outline H4. In this manner, it is possible to excite the sub-vibration of the crystal unit 103 by producing the alternating electric field among the first to fourth sub-electrodes 71 to 74. The sub-vibration of the form as illustrated in FIG. 17 is called a contour vibration involving a change in contour of the crystal blank 10, as in the sub-vibration described above with reference to FIG. 4.

This Embodiment 3 may excite the same contour vibration as the above-described Embodiment 1 and achieve the same effect as the Embodiment 1, although the former is different from the latter in terms of mode. That is, as the frequency characteristics of impedance between the external electrodes 42 and 44 according to the sub-vibration, the impedance characteristics close to the single characteristics of the crystal unit 103 may be obtained from the external monitor terminals 110 and 112 under the state where the crystal unit 103 is mounted. This allows the crystal unit 103 to be inspected under the state where the crystal unit 103 is mounted.

While various embodiments have been described in the above, the disclosed embodiments are not intended to have a limited sense but may be modified and altered in various ways without departing from the spirit and scope of the invention defined in the claims. In addition, combinations of all or some of elements described in the above embodiments may be made.

For example, although it has been illustrated in the above embodiments that the sub-vibration is the specific form of contour vibration (e.g., a form having a node near the center of each side) as illustrated in FIG. 2, the sub-vibration may be different forms of contour vibrations.

In addition, although it has been illustrated in the above embodiments that the sub-vibration electrode 70 is formed on the body of the housing 30, the sub-vibration electrode 70 may be formed at other parts (e.g., such as the cover 34) of the housing 30.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A crystal unit comprising:
   a crystal blank;
   an excitation electrode formed on the crystal blank and excites a main vibration of the crystal blank;
   a housing that accommodates the crystal blank; and
   a sub-vibration electrode formed on the housing and excites a sub-vibration of the crystal blank.

2. The crystal unit according to claim 1, further comprising:
   an external electrode which is formed on the outer surface of the housing and is electrically coupled to the sub-vibration electrode.

3. The crystal unit according to claim 2, wherein the sub-vibration electrode is formed to apply an electric field to the crystal blank in a direction oblique to the direction of the main vibration, the electric field being parallel to a substrate surface of the crystal blank.

4. The crystal unit according to claim 2, wherein the sub-vibration electrode faces the crystal blank in the thickness direction of the crystal blank.

5. The crystal unit according to claim 2, wherein the sub-vibration electrode includes
   a first sub-electrode which faces a first region of the crystal blank in the thickness direction of the crystal blank,
   a second sub-electrode which faces a second region of the crystal blank in the thickness direction of the crystal blank, a third sub-electrode which faces a third region of the crystal blank in the thickness direction of the crystal blank, and a fourth sub-electrode which faces a fourth region of the crystal blank in the thickness direction of the crystal blank, wherein the first region and the second region are located at one end side and the other end side of the crystal blank, respectively, in a direction perpendicular to the direction of the main vibration with respect to the center of the crystal blank when viewed from the thickness direction of the crystal blank, and the third region and the fourth region are located at one end side and the other end side of the crystal blank, respectively, in the direction of the main vibration with respect to the center of the crystal blank.

6. The crystal unit according to claim 2, further comprising:

a conductor pattern which is formed on the inner layer or surface of the housing and electrically couples the sub-vibration electrode to the external electrode.

7. The crystal unit according to claim 6, further comprising:

a via hole which is formed in the housing and is electrically coupled to the conductor pattern.

8. The crystal unit according to claim 5, wherein the external electrode includes a first external electrode and a second external electrode, the first sub-electrode and the second sub-electrode are electrically coupled to the first external electrode via a first conductor pattern formed on the housing, and the third sub-electrode and the fourth sub-electrode are electrically coupled to the second external electrode via a second conductor pattern formed on the housing.

9. The crystal unit according to claim 5, wherein the external electrode includes a first external electrode and a second external electrode, the first sub-electrode and the fourth sub-electrode are electrically coupled to the first external electrode via a first conductor pattern formed on the housing, and the second sub-electrode and the third sub-electrode are electrically coupled to the second external electrode via a second conductor pattern formed on the housing.

10. The crystal unit according to claim 8, wherein the first conductor pattern and the second conductor pattern are formed on the inner layer or surface of the housing.

11. The crystal unit according to claim 2, wherein the sub-vibration electrode is formed on the inner surface of the housing.

12. The crystal unit according to claim 2, wherein the sub-vibration electrode and the external electrode are electrically isolated from an oscillation circuit according to the main vibration.

13. The crystal unit according to claim 1, wherein the main vibration is a thickness sliding vibration and the sub-vibration is a contour vibration.

14. The crystal unit according to claim 1, wherein the housing has a multi-layered structure made of a ceramic material.

15. An electronic apparatus comprising:

a crystal unit including a crystal blank, an excitation electrode formed on the crystal blank and excites a main vibration of the crystal blank, a housing that accommodates the crystal blank;

a sub-vibration electrode formed on the housing and excites a sub-vibration of the crystal blank, and a first external electrode and a second external electrode which are formed on the outer surface of the housing and are electrically coupled to the sub-vibration electrode;

a substrate on which the crystal unit is mounted;

a first wiring and a second wiring which are formed on the substrate and are electrically coupled to the first and second external electrodes, respectively; and a first terminal and a second terminal which are formed on the substrate and are coupled to end portions of the first and second wirings, respectively.

* * * * *